US009920420B2

(12) United States Patent
Itoh et al.

(10) Patent No.: US 9,920,420 B2
(45) Date of Patent: Mar. 20, 2018

(54) SINTERED BODY, SPUTTERING TARGET AND MOLDING DIE, AND PROCESS FOR PRODUCING SINTERED BODY EMPLOYING THE SAME

(71) Applicants: Kenichi Itoh, Yokohama (JP); Masami Mesuda, Sagamihara (JP); Hitoshi Nagayama, Kawasaki (JP); Tetsuo Shibutami, Sagamihara (JP); Shunsuke Yatsunami, Yamagata (JP)

(72) Inventors: Kenichi Itoh, Yokohama (JP); Masami Mesuda, Sagamihara (JP); Hitoshi Nagayama, Kawasaki (JP); Tetsuo Shibutami, Sagamihara (JP); Shunsuke Yatsunami, Yamagata (JP)

(73) Assignee: TOSOH CORPORATION, Yamaguchi (JP)

( * ) Notice: Subject to any disclaimer, the term of this patent is extended or adjusted under 35 U.S.C. 154(b) by 0 days.

(21) Appl. No.: 14/805,107

(22) Filed: Jul. 21, 2015

(65) Prior Publication Data

US 2015/0368791 A1    Dec. 24, 2015

Related U.S. Application Data

(62) Division of application No. 13/846,094, filed on Mar. 18, 2013, now abandoned, which is a division of (Continued)

(30) Foreign Application Priority Data

Feb. 1, 2005   (JP) .................................. 2005-025655

(51) Int. Cl.
C23C 14/00 (2006.01)
C23C 14/34 (2006.01)
(Continued)

(52) U.S. Cl.
CPC .......... *C23C 14/3414* (2013.01); *B28B 3/003* (2013.01); *B28B 7/0097* (2013.01);
(Continued)

(58) Field of Classification Search
CPC ........................... B22F 3/00; C04B 2235/3293
See application file for complete search history.

(56) References Cited

U.S. PATENT DOCUMENTS 3,922,127 A   11/1975   Schwarzkopf
4,133,626 A    1/1979   Schubert
(Continued)

FOREIGN PATENT DOCUMENTS

CN   1218843 A     6/1999
EP   0342537 A1   11/1989
(Continued)

OTHER PUBLICATIONS

Japanese Office Action dated Jan. 4, 2012 issued in corresponding Japanese Patent Application No. 2006-024494.
(Continued)

*Primary Examiner* — Timon Wanga
(74) *Attorney, Agent, or Firm* — Sughrue Mion, PLLC; Richard C. Turner

(57) ABSTRACT

Provided is an apparatus that includes a molding die for producing a sintered body. The molding die is configured for cold isostatic pressing and includes a knockdown mold frame comprised of plural frame members and a bottom plate provided in contact with the knockdown mold frame. An upper punch is provided to be movable along the inner surface of the knockdown mold frame. The frame members configured to be movable relative to each other to accommodate an expansion of a green body which takes place at the time of reducing the pressure after the completion of pressing.

6 Claims, 5 Drawing Sheets

Related U.S. Application Data application No. 11/815,163, filed as application No. PCT/JP2006/301357 on Jan. 27, 2006, now Pat. No. 8,419,400.

(51) Int. Cl.

| | | |
|---|---|---|
| *B28B 3/00* | (2006.01) | |
| *B30B 15/02* | (2006.01) | |
| *C04B 35/453* | (2006.01) | |
| *C04B 35/457* | (2006.01) | |
| *C04B 35/468* | (2006.01) | |
| *C04B 35/47* | (2006.01) | |
| *C23C 14/08* | (2006.01) | |
| *B28B 7/00* | (2006.01) | |
| *H01J 37/34* | (2006.01) | |

(52) U.S. Cl.
CPC .......... *B30B 15/024* (2013.01); *C04B 35/453* (2013.01); *C04B 35/457* (2013.01); *C04B 35/4682* (2013.01); *C04B 35/47* (2013.01); *C23C 14/086* (2013.01); *H01J 37/3426* (2013.01); *B22F 2998/00* (2013.01); *B22F 2998/10* (2013.01); *C04B 2235/3213* (2013.01); *C04B 2235/3217* (2013.01); *C04B 2235/3284* (2013.01); *C04B 2235/3286* (2013.01); *C04B 2235/604* (2013.01); *C04B 2235/6562* (2013.01); *C04B 2235/6565* (2013.01); *C04B 2235/721* (2013.01); *C04B 2235/77* (2013.01); *Y10T 428/266* (2015.01)

(56) References Cited

U.S. PATENT DOCUMENTS

| | | | |
|---|---|---|---|
| 5,009,584 A | | 4/1991 | Uehara et al. |
| 5,057,273 A | * | 10/1991 | Hanson ............... B22F 3/04 264/500 |
| 5,194,196 A | | 3/1993 | Chance et al. |
| 5,401,701 A | * | 3/1995 | Ogawa ............... C23C 14/3414 204/298.13 |
| 5,980,815 A | * | 11/1999 | Matsunaga ............ B02C 19/06 241/5 |
| 2001/0037938 A1 | | 11/2001 | Sato et al. |
| 2003/0159925 A1 | | 8/2003 | Sako |
| 2003/0183508 A1 | | 10/2003 | Weigert et al. |
| 2004/0222089 A1 | | 11/2004 | Inoue et al. |
| 2005/0191202 A1 | | 9/2005 | Iwasaki et al. |

FOREIGN PATENT DOCUMENTS

| | | |
|---|---|---|
| EP | 0666336 A1 | 8/1995 |
| JP | 1-290764 A | 11/1989 |
| JP | 3-37478 A | 2/1991 |
| JP | 3-182732 A | 8/1991 |
| JP | 04-200999 A | 7/1992 |
| JP | 5-287315 A | 11/1993 |
| JP | 5-311428 A | 11/1993 |
| JP | 6-100903 A | 4/1994 |
| JP | 6-182732 A | 7/1994 |
| JP | 7-187769 A | 7/1995 |
| JP | 7-278607 A | 10/1995 |
| JP | 8-9120 A | 1/1996 |
| JP | 8-246139 A | 9/1996 |
| JP | 61-266204 A | 11/1996 |
| JP | 9-3636 A | 1/1997 |
| JP | 9-57495 A | 3/1997 |
| JP | 9-302462 A | 11/1997 |
| JP | 10-330169 A | 12/1998 |
| JP | 2896233 B2 | 3/1999 |
| JP | 2000-144393 A | 5/2000 |
| JP | 2000-233299 A | 8/2000 |
| JP | 2001-2471 A | 1/2001 |
| JP | 2003-2737 A | 1/2003 |
| JP | 2003-3257 A | 1/2003 |
| JP | 2003-55049 A | 2/2003 |
| JP | 2003-167324 A | 6/2003 |
| JP | 2003-266198 A | 9/2003 |
| JP | 2004-359984 A | 12/2004 |
| JP | 2006-241595 A | 9/2006 |

OTHER PUBLICATIONS

Taiwanese Office Action dated Aug. 9, 2011 issued in corresponding Taiwanese Patent Application No. 095103530.
Japanese Office Action dated Nov. 4, 2012 issued in corresponding Japanese Patent Application No. 2006-024494.
Translation of First Chinese Office Action.
Japanese Office Action dated Jan. 4, 2011 in corresponding Japanese Patent Application No. 2006-024494.
Japanese Office Action, dated Sep. 10, 2013, issued in corresponding Japanese Patent Application No. 2006-024494.
Japanese Office Action issued in Japanese Application No. 2012-286146, drafted Apr. 14, 2014, dated Apr. 24, 2014.

* cited by examiner

SINTERED BODY, SPUTTERING TARGET AND MOLDING DIE, AND PROCESS FOR PRODUCING SINTERED BODY EMPLOYING THE SAME

CROSS-REFERENCE TO RELATED APPLICATIONS

This is a Divisional Application of U.S. application Ser. No. 13/846,094, filed Mar. 18, 2013, which is a Divisional Application of U.S. application Ser. No. 11/815,163, filed Jul. 31, 2007, which is a National Stage of PCT/JP2006/301357 filed Jan. 27, 2006, which claims the benefit of Japanese Application No. 2005-025655 filed Feb. 1, 2005. The entire disclosures of the prior applications are incorporated herein by reference.

TECHNICAL FIELD

The present invention relates to a sintered body obtainable by firing a green body which is obtained by molding a ceramic powder or a metal powder, or a mixed powder thereof by means of cold isostatic pressing, a sputtering target employing the sintered body and a molding die to be used for the production of the green body, and a process for producing a sintered body employing the molding die.

BACKGROUND ART

A green body obtained by molding a ceramic powder or a metal powder, or a mixed powder thereof, into a plate form, may be fired and processed after the molding and used as a sputtering target material or an abrasion resistant material. The sputtering target material is used as a material for the preparation of a thin film by a sputtering method and is used for e.g. the production of LCD (liquid display), EL (electroluminescence) or semiconductors. Recently, along with the trend for large sizes of such LCD or semiconductor products, there has been a strong demand for enlarging the target material. Further, with ITO (indium tin oxide) targets, black deposits so-called nodules tend to precipitate on the target surface as the integrated sputtering time increases, which will be a cause for abnormal electrical discharge. It is known that once such abnormal electrical discharge takes place, yield of the product will decrease. Therefore, it is strongly desired to improve the performance of the target material to reduce such abnormal electrical discharge. Accordingly, a large and high density sintered body is strongly desired.

In order to suppress generation of such abnormal electrical discharge and formation of nodules, various studies have heretofore been made e.g. for high densification of target materials or flattening of the sputtering surface. Patent Document 1 discloses that with respect to an ITO target, elements belonging to Groups IIIb and IVb of the Periodic Table such as Al, Si, etc. contained in the target are controlled to be 50 ppm or less, but nothing is specifically mentioned with respect to the influence of carbon. Further, with respect to the influence of carbon in a target, Patent Document 2 discloses that with respect to an ITO target, by an addition of any one of carbon, nitrogen and boron, it is possible to obtain an improvement and stabilization of the etching rate of the obtainable transparent conductive film, and it is preferred that the carbon content is from 0.005 to 3%, the nitrogen content is from 0.1 to 5%, and the boron content is from 0.001 to 10%.

On the other hand, heretofore, as a method for molding a ceramic powder or a metal powder, or a mixed powder thereof, into a plate shape, a dry press molding method, a casting method or a cold isostatic press method has been employed.

The dry press molding method is a method wherein a binder is added to a raw material powder and by means of a mold, a green body is formed, and the casting method is a method wherein a binder is added to a raw material powder to form a slurry, which is cast in a casting mold to produce a cast green body. For the purpose of higher densification, such a green body (primary green body) may further be subjected to cold isostatic pressing to produce a high density post-formed product. As an example, production of an alloy target (IT target) composed of metallic indium and metallic tin, or a composite oxide target (ITO target) composed of indium oxide and tin oxide may be mentioned (e.g. Patent Documents 3 and 4). Such a molding method had a drawback that the production process tended to be complex, although a high density target was obtainable. Further, there was such a drawback that an expensive dry molding die or casting mold was required, and the cost for the molding die tended to be high when a large green body was to be prepared. Further, there was a drawback that the production cost tended to be high since granulation or slurrying of the raw material powder was required.

In contrast with such a production method, Patent Document 5 discloses a method wherein a powder is filled in an inexpensive rubber mold and directly formed under high pressure by cold isostatic pressing without primary molding. Further, with respect to cracking of a green body by restoration of a rubber mold, Patent Document 6 proposes a method for preventing such cracking of the green body by using a rubber having a small rebound resilience value. Further, with respect to cracking of a green body due to fixing of the green body to the rubber mold, Patent Document 7 reports that such cracking can be avoided by incorporating a material which undergoes substantially no elastic recovery at the time of reducing the pressure.

In order to improve the shape accuracy, the above-mentioned Patent Document 5 proposes a method for direct forming under high pressure by cold isostatic pressing by means of a mold with one side made of a metal plate. As a method to obtain a green body having a still better shape accuracy by means of cold isostatic pressing, Patent Document 8 reports a method wherein a powder is sandwiched between a pair of metal plates, vacuum-packed and then preformed by cold isostatic pressing under a pressure of from 5 to 50 MPa, and thereafter, vacuum packing is applied again, and main forming is carried out by cold isostatic pressing. Further, Patent Document 9 proposes a method wherein a mold filled with a raw material powder is closed and sealed, and then inserted in a cold isostatic press, followed by high pressure molding. Patent Document 10 proposes a method for molding by cold isostatic pressing by means of a mold comprising a knockdown mold frame made of a resin and a molding punch. In this method, the mold frame can be disassembled, and it is easy to take out the green body from the mold. Patent Document 11 proposes a molding die comprising a dividable mold frame and a cover made of an elastic material. Patent Document 12 proposes that a molding die comprising a dividable mold frame and a molding punch is covered with a soft material, and CIP molding is carried out.

On the other hand, as the size of a green body becomes large, in order to maintain the green body, its strength is required to be increased. However, in a case where a large green body having a surface of e.g. 3,000 cm², is to be prepared, it is not possible to apply a large pressure by press molding, and it is not possible to increase the strength of the green body. Therefore, in order to increase the strength, it becomes necessary to add a molding aid such as a binder. Then, a firing step (degreasing step) intended to remove organic substances in the green body by firing will be required. When a molding aid such as a binder is burned or decomposed, the green body is likely to have cracks, and in order to prevent such cracking, it is required to raise the temperature at an extremely low rate, and it will take a long time accordingly. For example, it is disclosed in Patent Document 13 that in order to prepare a plate-form sintered body having a size of 1,000 cm² or more in good yield, it is necessary to raise the temperature at an extremely low rate of 2° C./hr or less.

Further, in order to increase the efficiency in the use of a target, Patent Document 14 discloses that the erosion region of the target is made thicker than other portions.

Patent Document 1: JP-A-08-246139
Patent Document 2: JP-A-07-187769
Patent Document 3: JP-A-2000-144393
Patent Document 4: JP-A-05-311428
Patent Document 5: JP-A-2003-003257
Patent Document 6: JP-A-09-057495
Patent Document 7: JP-A-06-100903
Patent Document 8: JP-A-09-003636
Patent Document 9: JP-A-05-287315
Patent Document 10: JP-B-08-009120
Patent Document 11: JP-A-61-266204
Patent Document 12: JP-A-2003-266198
Patent Document 13: JP-A-10-330169
Patent Document 14: JP-A-01-290764

DISCLOSURE OF THE INVENTION

Problems to be Solved by the Invention

As mentioned above, with respect to impurities in a sintered body to be used for a sputtering target, Patent Document 1 discloses that the amount of elements belonging to Groups IIIb and IVb of the Periodic Table is made to be 50 ppm or less thereby to suppress abnormal discharge or formation of nodules, but nothing is specifically disclosed with respect to the influence of carbon as an element belonging to Group IVb. In this Patent Document 1, a green body is prepared by using a molding aid such as a binder containing an organic substance, but in such a case, it is common to carry out degreasing treatment at a temperature of from 300 to 600° C. to remove the added organic substance before the main firing for sintering. However, by such degreasing treatment, it is extremely difficult to completely remove the organic substance in the sintered body, and carbon formed by the decomposition of the organic substance will remain in the green body. Practically, in a case where a binder is added in an amount of 1 wt % or more, it is difficult to bring the carbon content in the resulting sintered body to a level of 50 ppm or less. Further, as the thickness of the green body is thick, the degreasing tends to be incomplete, and the carbon remained in the sintered body tends to be large in amount.

Further, as disclosed in Patent Document 2, if the carbon content is large in the case of an ITO target, the etching rate of the obtainable thin film tends to be high, and accordingly, in order to maintain the quality of the target to be constant and to maintain a proper etching rate, it is necessary to control the carbon content in the sintered body.

On the other hand, with respect to the molding method by cold isostatic pressing, as mentioned above, Patent Document 5 discloses a method wherein a powder is filled in an inexpensive rubber mold and directly formed under high pressure by cold isostatic pressing without primary molding. However, in the molding by such a method, since the mold is made of a thick rubber mold, during the pressing, a bending stress is likely to form, whereby the center portion tends to be substantially deformed. Therefore, the obtainable green body tends to have a thickness thicker at the center portion than the end portions in a plane direction, whereby it is possible to obtain only a green body poor in shape-accuracy. Further, in such a method, in the process for reducing the pressure after the pressure molding, the rubber form will be finally restored to the state before pressing, by the restoration force due to the elasticity of the rubber form itself, but the green body remains to be shrinked, whereby there will be a drawback that due to e.g. fixing of the green body to the rubber mold, a part of the green body tends to be peeled, or the green body tends to be cracked.

With respect to such cracking of the green body due to restoration of the rubber mold, Patent Document 6 proposes a method for preventing the cracking of the green body by using a rubber mold having a small rebound resilience value. However, such a method has a drawback that depending upon the type of the powder (the strength of the green body) or in a case where the green body is large-sized, if the powder is fixed to the rubber mold even in a small extent, the green body is likely to undergo cracking by spring back of the green body. Therefore, such a method is not necessarily satisfactory in the case of producing a large green body having a low strength. Further, the portion in contact with the rubber mold tends to be poor in shape-accuracy.

With respect to cracking of the green body due to fixing of the green body to the rubber mold, Patent Document 7 reports that the cracking can be avoided by incorporating a material which undergoes substantially no elastic recovery at the time of reducing the pressure. However, even by this method, the shape-accuracy tends to be still poor, and in order to finish to have a desired product shape, the grinding amount tends to increase, and consequently, there will be a drawback that the amount of the raw material powder required, will increase, and the production cost tends to be high. Further, as the grinding amount increases, the processing time required for grinding tends to be long, thus leading to a drawback that the processing cost will increase. In the case of a product which requires a large amount of an expensive raw material, it is very important to obtain a green body having good shape accuracy also from the viewpoint of costs.

In order to improve the shape accuracy, Patent Document 5 proposes a method wherein a mold having one side made of a metal plate is used, and molding under high pressure is carried out directly by cold isostatic pressing. However, also by this method, the surface made of a rubber is still poor in shape accuracy, and further, as mentioned above, there is a drawback that cracking or peeling is likely to result due to the difference in elastic recovery between the rubber mold and the green body.

As a molding method for better shape accuracy employing cold isostatic pressing, Patent Document 8 reports a method wherein a powder is sandwiched between a pair of metal plates, vacuum-packed and then preformed by cold isostatic pressing under a pressure of from 5 to 50 MPa, and then, vacuum packing is applied again and main forming is carried out by cold isostatic pressing. However, this method requires two forming steps i.e. preforming and main forming, and does not have an effect to simplify the process by omitting the primary molding in the conventional two stage molding treatment. Further, it is necessary to use an expensive cold isostatic press apparatus twice, and the method is thus poor also in productivity.

Patent Document 9 proposes a method wherein a mold filled with a raw material powder is closed and sealed, and inserted in a cold isostatic press, followed by high pressure molding. This method is basically a uniaxial pressing, whereby a green body excellent in shape accuracy will be obtained. However, if the same mold as used for such a uniaxial pressing is employed and molding is carried out under such a high pressure as in cold isostatic pressing, spring back of the green body after releasing the molding pressure tends to be large. Accordingly, there is a drawback that due to expansion of the green body by such spring back, it tends to be difficult to take out the green body from the mold. Especially in the case of molding a highly bulky powder or a large size product, such spring back will be larger, whereby there will be a problem that the green body is likely to break at the time of releasing from the mold.

To solve such a problem, Patent Document 10 proposes a method for molding by cold isostatic pressing using a mold comprising a knockdown mold frame and a molding punch. The mold frame can be disassembled, whereby it becomes easy to take out the green body from the mold. However, even by this method, the problem of spring back can not completely be solved, and there remains a drawback that due to an expansion of the green body by such spring back after reducing the pressure, a stress is exerted between the green body and the frame, whereby the green body is likely to be broken. Especially in the case of a large green body such as a target, the spring back tends to be large, and a correspondingly large stress will be formed between the green body and the frame, whereby there will be a drawback that the green body will be broken as not being durable against such a stress.

Further, the Patent Document 11 proposes a molding die comprising a dividable mold frame and a cover made of an elastic material. This method has such a construction that an expansion of the green body by spring back in a direction perpendicular to the direction of pressure transmission is absorbed by the dividable mold frame, but pressing by hydrostatic pressure against the green body is carried out via the cover made of an elastic material. Therefore, in the process for reducing the pressure after the press molding, the cover made of an elastic material will be restored to the state before the pressing due to the restoration force by the elasticity of the cover itself, whereby the pressure exerted to the green body will be different as between the direction of the pressure transmission and the direction perpendicular thereto. Especially when the green body is large-sized, a large non-uniform force will thereby be exerted to the green body, thus leading to a drawback that the green body will break. Further, by the pressing via the cover made of an elastic material, the force exerted to the green body during the pressing tends to be non-uniform, thus leading to such a drawback that not only the green body is likely to break, but also the surface in contact with the elastic material tends to have a non-uniform shape thus leading to poor shape accuracy.

Patent Document 12 proposes that a molding die comprising a dividable mold frame and a molding punch, is covered with a soft material, and CIP molding is carried out. In this method, the mold frame is divided into two or more members and not fixed, whereby it is possible to avoid cracking of the green body by spring back. However, frame members are not fixed to one another, whereby the stability of the entire mold is poor, and it is necessary to cover the molding die with a rubber medium to maintain the shape of the mold. In this case, in the process for reducing the pressure after the high pressure molding, the rubber medium will be restored to the state before the pressing due to the restoration force by the elasticity of the medium itself, but the upper punch of the molding die will remain at the position of the shrinked green body. Further, the divided side walls will move to the positions expanded by the spring back. Therefore, a large space will be formed between the upper punch and the rubber medium, but there will be no space between the side walls and the rubber medium, as the green body is expanded. Consequently, the pressure exerted to the green body will be different as between the vertical direction and the horizontal direction. Therefore, especially when the green body is large-sized, a large non-uniform force will be exerted to the green body, thus leading to a drawback that the green body will break. Further, the side walls have a construction to press the upper and lower punches, whereby there will be a drawback that slidability of the upper and lower punches tends to be poor, and uniform pressing can not be done, whereby the green body will break. Further, leakage of the filled powder from a clearance of the mold is likely to occur, and the amount of the filled powder tends to be partially small, whereby the density of the green body tends to be non-uniform. These phenomena tend to be remarkable as the size of the green body increases.

On the other hand, in Patent Document 14, the erosion region of the target is made thick to increase the efficiency in the use of the target. However, as a large sintered body is formed in such a form by cold isostatic pressing, there will be a problem such that a convex portion of the sintered body will expand by spring back at the time of reducing the pressure after completion of the pressing, whereby cracking is likely to result.

As mentioned above, as a target material for a sputtering target, a large size, high density sintered body having a small content of impurities, is desired. Further, with respect to the shape of the sintered body, not only a flat plate-form sintered body, but a sintered body with a thickness of the erosion region made thick which has a large size and a high density and which has a small content of impurities, is desired for improvement of the efficiency in the use of the target.

In the preparation of a large green body to be used for the production of a large sintered body, it is preferred to carry out pressure molding by a cold isostatic press in order to obtain a high compression pressure. However, as mentioned above, there is a problem such that the green body is likely to be cracked by spring back which takes place in the green body at the time of reducing the pressure after completion of the molding. Such spring back tends to be large as the green body is large sized, and the green body receives such an influence more strongly when the green body is not uniform. Therefore, it has been attempted to add an organic additive to the raw material powder, followed by granulation in order to improve the flowability of the raw material powder to uniformly fill it, or to add a molding aid such as a binder to the raw material powder in order to supplement a decrease in the relative strength of the green body. However, with a green body prepared by using such a raw material powder, a degreasing step is required to remove the organic additive of the molding aid such as a binder by heating, whereby not only it takes time for the production of the sintered body, but also there will be a problem such that the density of the obtainable sintered body tends to be low or the non-uniformity of the density tends to increase, and further, carbon not removed will remain as an impurity in the sintered body.

The present invention is to provide a process for producing a sintered body, whereby a thick sintered body having a thickness of 10 mm or more, a large high density sintered body with an area of a plate surface being 600 cm$^2$ or more, preferably 1,000 cm$^2$ or more, more preferably 3,000 cm$^2$ or more, or a large high density sintered body having a thickness of an erosion region made thick, may, for example, be prepared without adding a molding aid such as a binder to the raw material powder, or even when adding it, with its amount limited to an extremely small amount, so that a firing step for the purpose for removing an organic substance in the green body is not required in the production of a sintered body, by a simple method without breakage or formation of cracks and yet, with excellent shape accuracy, and a molding die to be used for such a process, and further to provide a large high density sintered body and a large high performance sputtering target employing the same.

Means to Solve the Problems

The present inventors have conducted an extensive study on a sintered body to be used for a sputtering target and sputtering characteristics, and as a result, have found that in a sintered body containing no carbon as a constituting element, when the content of carbon contained as an impurity in the sintered body is less than 0.005 wt %, the discharging characteristics in sputtering and the characteristics of the obtainable thin film will be good. The present invention has been accomplished on the basis of such a discovery.

Further, they have conducted an extensive study on a molding die to be used for the production of a green body by filling a raw material powder in the molding die, followed by compression molding as a process for producing a green body which will be a sintered body by firing and as a result, have found a method which is capable of improving the shape accuracy of the green body and further capable of preventing breakage of the green body by resolving the stress due to spring back which takes place at the time of molding, by adjusting the structures and materials of components constituting the molding die to have such a construction that at the time of pressure compression, pressing is applied to a filled raw material powder only in a substantially uniaxial direction, and at the time of reducing the pressure after the completion of pressing, the pressure can be released substantially isotropically with respect to the green body. Thus, the present invention has been accomplished on the basis of this discovery.

Namely, a first embodiment of the sintered body of the present invention is a sintered body which is a sintered body containing no carbon as a constituting element and which is characterized in that the content of carbon contained as an impurity in the sintered body is less than 0.005 wt %. Further, the thickness of the sintered body may be made to be 10 mm or more, and one or more flat surface areas constituting the surface of the sintered body may be made to be 600 cm$^2$ or more, preferably 1,000 cm$^2$ or more, more preferably 3,000 cm$^2$ or more. The sintered body may be a sintered body wherein each of the upper and lower surfaces of the sintered body is constituted by one flat surface, like a simple flat plate sintered body. Otherwise, it may be a sintered body having one or more convex portions on at least one of the upper and lower surfaces of the sintered body, like a plate sintered body having a thickness of a specific portion made thick by providing a convex portion on the plate surface. Further, such a sintered body is preferably one wherein the sintered density of the entire sintered body is 90% or more, and the fluctuation in the sintered density in the sintered body is 0.2% or less, i.e. it is further preferred that the difference in the sintered density between the portion where the sintered density is largest and the portion where it is smallest, is 0.2% or less.

A second embodiment of the sintered body of the present invention is a sintered body which is characterized in that the area of the largest surface among surfaces constituting the surface of the sintered body is 1,000 cm$^2$ or more, preferably 3,000 cm$^2$ or more, and the sintered density of the entire sintered body is 90% or more. This sintered body is preferably such that the fluctuation in the sintered density in the sintered body is 0.2% or less, i.e. the difference in the sintered density between the portion where the sintered density is largest and the portion where it is smallest is 0.2% or less. Further, such a sintered body may be a sintered body having a rectangular parallelepiped shape, wherein the ratio in length of the longest ridge to the shortest ridge is 40 or more, or it may be one which has one or more convex portions on at least one of the upper and lower surfaces of the sintered body.

Further, the sputtering target of the present invention is a sputtering target which is characterized in that the above-described sintered body is used as a target material.

The molding die of the present invention is a molding die for compression molding, which is a molding die for producing a green body by filling and compressing a raw material powder in the molding die and which is characterized by having such a construction that at the time of pressure compression, pressing is applied to a filled raw material powder only in a substantially uniaxial direction, and at the time of reducing the pressure after the completion of pressing, the pressure can be released substantially isotropically with respect to the green body. In a case where molding is carried out in a state where the plate surface of the green body is set to be horizontal, a force due to the own weight of the green body or due to the weight of the upper punch will be exerted to the green body. However, with the green body of the present invention, the pressure by such a force may be ignored, since the area of the plate surface of the green body is large.

A first specific embodiment of the molding die of the present invention is a molding die for cold isostatic pressing, which is a molding die for producing a green body by molding a raw material powder filled in the molding die by cold isostatic pressing and which is characterized by comprising a knockdown mold frame composed of plural frame members, an upper punch provided to be movable along the inner surface of the knockdown mold frame and a bottom plate provided in contact with the knockdown mold frame, and having such a construction that the frame members constituting the knockdown mold frame are movable to accommodate an expansion of a green body which takes place at the time of reducing the pressure after the completion of pressing. Here, the bottom plate is preferably set so that it is not movable along the inner surface of the knockdown mold frame. Further, the bottom plate is preferably made of a material which is less susceptible to compressive deformation than the upper punch, and particularly preferably, the bottom plate is made of a metal, and the upper punch is made of a resin.

Further, in the above molding die of the present invention, it is preferred that at least some of the frame members constituting the knockdown mold frame have, at their ends, a structure which engages with an end of the adjacent frame member so as to prevent the shape of an opening of a compartment to be filled with the raw material powder, formed by the knockdown mold frame, from becoming smaller than a predetermined size under the molding pressure. Here, in the present invention, "a compartment to be filled with the raw material powder" means a space defined by the inner surface of the knockdown mold frame, the bottom surface of the upper punch and the upper surface of the bottom plate or the lower punch, and the cross-sectional shape of this compartment to be filled with the raw material powder in a plane in parallel with the bottom surface of the upper punch is referred to as the shape of an opening of the compartment to be filled with the raw material powder or as the shape of an opening of the knockdown mold frame.

Further, each of the surfaces of the bottom plate and the upper punch to be in contact with the raw material powder may be constituted by one flat surface, and the bottom plate may be composed of plural movable bottom plate-constituting members and may have one or more concave portions on its surface to be in contact with the raw material powder. Likewise, the upper punch may be composed of plural movable upper punch-constituting members and may have one or more concave portions on its surface to be in contact with the raw material powder.

A second specific embodiment of the molding die of the present invention is a molding die for cold isostatic pressing, which is a molding die for producing a green body by molding a raw material powder filled in the molding die by cold isostatic press and which is characterized by comprising a knockdown mold frame composed of plural frame members, and an upper punch and a lower punch to be inserted in the knockdown mold frame, having such a construction that the frame members are movable to accommodate an expansion of a green body which takes place at the time of reducing the pressure after the completion of pressing, and having a fixing mechanism to fix the frame members to one another to maintain the shape of an opening of the knockdown mold frame. Here, it is preferred to use a pin-member as a connecting member to connect the frame members to one another. In a case where a pin-member is used as the connecting member, it is preferred that at least some of the frame members have, at their ends, a connecting member-insertion portion into which the connecting member is inserted, and the connecting member-insertion portion has a movable region for the connecting member, so that the frame members are movable to accommodate an expansion of a green body which takes place at the time of reducing the pressure after the completion of pressing.

Further, in such a molding die, it is preferred that the lower punch is constituted by a bottom plate to be inserted in the knockdown mold frame and a pedestal having a shape larger than the shape of the opening of the knockdown mold frame. Further, it is preferred that the bottom plate is made of a material which is less susceptible to compressive deformation than the upper punch, and it is particularly preferred that the bottom plate is made of a metal, and the upper punch is made of a resin.

In the molding die, each of the surfaces of the upper punch and the lower punch (or the bottom plate) to be in contact with the raw material powder, may be constituted by one flat surface, and the lower punch (or the bottom plate) may be composed of plural movable lower punch-constituting members (or bottom plate-constituting members) and may have one or more concave portions on the surface of the lower punch (or bottom plate) to be in contact with the raw material powder. Likewise, the upper punch may be composed of plural movable upper punch-constituting members and may have one or more concave portions on the surface of the upper punch to be in contact with the raw material powder.

Further, the process for producing a green body of the present invention is a process for producing a green body, which comprises pressing a raw material powder filled in a molding die and which is characterized in that a molding die for compression molding is used which has such a construction that at the time of pressure compression, pressing is applied to a filled raw material powder only in a substantially uniaxial direction, and at the time of reducing the pressure after the completion of pressing, the pressure can be released substantially isotropically with respect to the green body.

Namely, a first specific embodiment of the process for producing a green body of the present invention is a process for producing a green body, which comprises molding a raw material powder filled in a molding die by cold isostatic pressing and which is characterized in that a molding die is used which comprises a knockdown mold frame composed of plural frame members, an upper punch provided to be movable along the inner surface of the knockdown mold frame and a bottom plate provided in contact with the knockdown mold frame, and which has such a construction that the frame members constituting the knockdown mold frame are movable to accommodate an expansion of a green body which takes place at the time of reducing the pressure after the completion of pressing.

Further, a second specific embodiment of the process for producing a green body of the present invention is a process for producing a green body, which comprises molding a raw material powder filled in a molding die by cold isostatic pressing and which is characterized in that a molding die is used which comprises a knockdown mold frame composed of plural frame members, and an upper punch and a lower punch to be inserted in the knockdown mold frame, which has such a construction that the frame members are movable to accommodate an expansion of a green body which takes place at the time of reducing the pressure after the completion of pressing, and which has a fixing mechanism to fix the frame members to one another to maintain the shape of an opening of the knockdown mold frame.

Further, in the process for producing a green body of the present invention, it is preferred that the bottom plate or the lower punch is set so that it is not movable along the inner surface of the knockdown mold frame. Further, it is preferred that the bottom plate or the lower punch is made of a material which is less susceptible to compressive deformation than the upper punch, and it is particularly preferred that the bottom plate or the lower punch is made of a metal, and the upper punch is made of a resin. Further, in the process for producing a green body of the present invention, the amount of an organic acid added to the raw material powder is preferably 0.6 wt % or less, and it is more preferred not to add a molding aid including an organic substance to the raw material powder.

A first embodiment of the process for producing a sintered body of the present invention is a process for producing a sintered body, which comprises pressing a raw material powder to form a green body and then, firing the green body to form a sintered body, characterized in that the raw material powder does not contain a molding aid containing an organic substance. Further, in this process, it is preferred that the raw material powder is molded directly by cold isostatic pressing to obtain the green body. For this purpose, it is preferred that molding of the raw material powder is carried out by using the above-described molding die, more preferably by using a green body produced by the above-described process for producing a green body.

Further, a second embodiment of the process for producing a sintered body of the present invention is a process for producing a sintered body, which comprises pressing a raw material powder to form a green body and then, firing the green body to form a sintered body, characterized in that the process does not have a firing step intended to remove an organic substance in the green body. Here, "a firing step intended to remove an organic substance in the green body" means a step for removing a flammable component in the green body by raising the temperature at a low speed in a low temperature range at a level of 600° C. or less, e.g. a firing step in which the time until a temperature reaches from 100° C. to 400° C. is 30 hours or more. In order to make such a firing step intended to remove an organic substance in the green body unnecessary, it is preferred to prepare the green body by using a raw material powder having an organic substance content of 0.6 wt % or less, more preferably 0.3 wt % or less. For this purpose, it is preferred to carry out the molding of the raw material powder by using the above-described molding die, particularly preferably by using a green body produced by the above-described process for producing a green body.

The present invention may be applied to sintered bodies of ceramics, metals or their mixtures. The ceramics may, for example, be oxides, nitrides, sulfides or double compounds such as oxynitrides, and the metals may, for example, be single metals such as Cr and Mo, or alloys such as TiW. The present invention may be particularly preferably applied to a sintered body using a ceramic powder as the raw material powder which will form a green body having a low density and weak strength as compared with a metal powder. Further, the molding die of the present invention is capable of almost completely absorbing spring back at the time of molding, and thus, it is applicable particularly suitably to a sintered body using, as the raw material powder, a ceramic powder having a degree of spring back being 0.1% or more, particularly an oxide powder such as ITO or AZO (aluminum zinc oxide). Here, the degree of spring back may strictly be defined as one obtained by dividing the difference in size between the green body after releasing the molding pressure and the green body during application of the molding pressure by the size of the green body during the application of the molding pressure. However, more conveniently, it may be calculated as a value $((A-B)/B)$ obtained by dividing the length obtained by deducting from the length (A) of one side of the green body after releasing the molding pressure the length (B) of the corresponding side of the compartment to be filled with the raw material powder, after releasing the molding pressure, by the length (B) of the corresponding side of the compartment to be filled with the raw material powder.

Further, the sintered body of the present invention other than the sintered body defined by the carbon content, may be a sintered body containing a carbide, etc. Further, the process for producing a sintered body of the present invention, or the molding die to be used for the process may be applied also to the production of a sintered body containing a carbide, etc.

Effects of the Invention

According to the present invention, it is possible to easily obtain a highly dense uniform sintered body, such as a highly dense uniform large-sized sintered body, a thin sintered body having a large plate surface area or a thick sintered body. Further, according to the present invention, it is possible to readily obtain a highly dense, uniform and large-sized sintered body even when it is a sintered body of a shape with its plate thickness being partially different. Further, it is possible to easily obtain such a sintered body which has a very small carbon content in the sintered body.

By using such sintered bodies, it is possible to provide large-sized sputtering targets with excellent performance, for example, such that a thin film having a low resistance can be obtained, without formation of nodules or generation of abnormal electrical discharge.

Further, according to the process for producing a green body of the present invention, molding by a high pressure is possible even for a large-sized green body, whereby it becomes possible to easily obtain a large high density uniform green body excellent in shape accuracy and free from cracks by subjecting a raw material powder directly to cold isostatic pressing, without necessity to add a molding aid such as a binder to the raw material powder, or by limiting the amount of such additive to be minimum. Further, the raw material powder can be directly molded by using only an inexpensive resin and metal plate materials without necessity to use an expensive die for dry pressing or mold for cast molding, whereby the production process may be simplified, and an economical production process may be provided.

Further, according to the process for producing a sintered body of the present invention, a firing step intended to remove an organic substance in a green body may be made unnecessary by using a green body obtained by the above-described process for producing a green body, i.e. by molding a raw material powder in which a molding aid such as a binder is not added or added in a very small amount, directly by cold isostatic pressing to obtain a green body and firing the obtained green body to obtain a sintered body. Therefore, the firing step can be carried out in a very short period of time, whereby a substantial improvement in the production efficiency can be accomplished.

Further, according to the present invention, a large high density sintered body having a plate surface being not flat and having a thickness partially different, can easily be prepared, whereby a large high density sputtering target having a thickness of the erosion region made thick, can be produced in good yield, whereby the efficiency in the use of the target can be substantially improved.

BRIEF DESCRIPTION OF THE DRAWINGS

FIG. 5(*a*) is a plan view, and FIG. 5(*b*) is a side view.

FIG. 11 is a plan view showing another embodiment of the molding die of the present invention.

Figure 1:
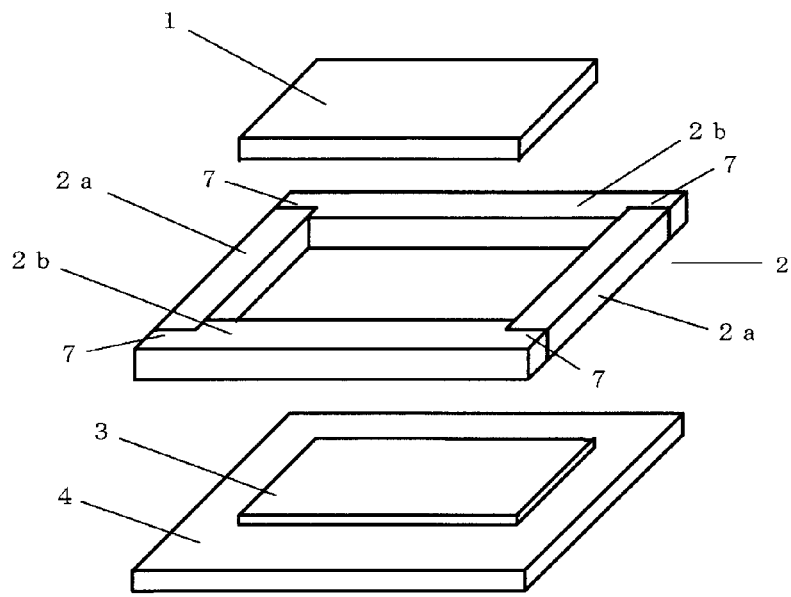
FIG. 1 is a perspective view schematically showing an embodiment of the molding die of the present invention as disassembled.

MEANINGS OF SYMBOLS 1, 11, 21, 31, 41, 51, 61: Upper punch
2, 12, 22, 32, 42, 52, 62: Knockdown mold frame
2a, 12a, 22a, 32a, 42a, 52a, 62a: Frame member
2b, 12b, 22b, 32b, 42b, 52b, 62b: Frame member
3, 13, 33, 43, 63: Bottom plate
33a, 33b, 33c, 33d, 33e, 33f: Bottom plate-constituting members
4, 14, 34, 44, 64: Pedestal
5: Raw material powder
6: Cushion
7, 8: Step
25: Urethane rubber mold
28, 58: Lower punch
55, 65: Bolt
56, 66: Nut
57: Bolt insertion hole
57a: Initial position of connecting member
57b: Movable region for connecting member

BEST MODE FOR CARRYING OUT THE INVENTION

Now, the present invention will be described in further detail with reference to specific embodiments.

The molding die for compression molding of the present invention and the process for producing a green body using the same, may be used at the time of producing a green body to be used for the production of a sintered body to be used for e.g. a sputtering target.

For example, a sputtering target is produced by using a sintered body obtainable by mixing a raw material powder as the case requires, followed by molding and firing, and such mixing of a raw material powder and firing of a green body can be carried out by methods which are commonly employed.

The raw material powder to be used in the present invention is not particularly limited, but a powder of a metal oxide such as alumina, ITO (indium tin oxide), IZO (indium zinc oxide), AZO (aluminum zinc oxide), GZO (gallium zinc oxide), BST (barium strontium titanate) or STO (strontium titanate) or a powder of a metal such as Cr or Mo, may, for example, be mentioned.

In a case where mixing of a raw material powder is required, such mixing may be carried out by e.g. a ball mill, a jet mill or a cross mixer. It is preferred to apply pulverization and/or classification treatment of the raw material powder before mixing the raw material powder. By applying such pulverization and/or classification treatment, the particle size of the raw material powder will be microsized to facilitate uniform mixing, whereby it becomes possible to prevent non-uniformity of the density or deformation or cracking of the sintered body caused by the non-uniformity of the composition in the sintered body. Further, in a case where a carbonate is used as the raw material powder or in a case where carbon is substantially present in the powder, it is preferred to apply decarbonation treatment by calcining it in a powder state after mixing the powder. Further, it is needless to say that the above-mentioned mixing operation is not required in a case where only one type of a compound is used as the raw material powder.

In the present invention, when a cold isostatic press is used, molding is carried out under high pressure, and there will be no cracking as the spring back problem is solved, whereby powder treatment such as granulation which is usually carried out in a dry press molding method, is not necessarily required. However, granules obtained by granulation, or a granular powder having an average particle size of from 1 to 10 μm, may be used as a raw material, as the case requires. In the present invention, such powder treatment is not necessarily required, whereby the powder treating step before the molding may be simplified, and at the same time, it is possible to prevent inclusion of carbon into a sintered body.

Then, the raw material powder obtained as described above, is filled into a molding die, followed by compression molding. At that time, a molding die is used which has such a construction that at the time of pressure compression, pressing is applied to a filled raw material powder only in a substantially uniaxial direction, and at the time of reducing the pressure after the completion of pressing, the pressure can be released substantially isotropically with respect to the green body. Such a molding die may be made of a material having a high rigidity, and the shape accuracy of a green body thereby obtainable will be extremely good. Further, the pressure applied to the green body is released isotropically with respect to the green body, whereby a stress due to spring back which takes place at the time of molding will be resolved, and it becomes possible to obtain a green body free from cracking. Further, in order to increase the shape accuracy and strength of the obtainable green body and to avoid cracking, it is preferred that slide members of the molding die which play a role to transmit the pressure to the green body are smoothly slidable with a small sliding resistance, so that the green body can be uniformly pressed. Further, in order to avoid cracking of the green body, it is important to release the pressure isotropically at the time of reducing the pressure. Namely, if the releasing rate or releasing degree of the pressure loses the isotropy, cracking is likely to be caused. Especially in a case where a large green body having a large spring back is to be molded or a raw material powder having no or little amount of a molding aid such as a binder or lubricant added, is to be molded, it is very important to reduce the pressure isotropically. In a case where no or little amount of a molding aid such as a binder or lubricant used, the strength of the green body tends to be low, whereby the molding tends to be very difficult. However, with the molding die of the present invention, it is possible to mold a large green body even without using such a molding aid, for the above-mentioned reason. Further, in a case where no or little amount of a molding aid is used, it is possible to omit a degreasing step i.e. a step for removing the molding aid, and it is possible to solve a problem of cracking in the degreasing step due to decomposition of the molding aid which is mainly an organic substance, and further, the obtainable sintered body will be of high purity, since no carbon will remain. Especially, with a sputtering target, since a high purity sintered body can be obtained, abnormal electrical discharge during the sputtering can be suppressed, and the properties of the obtainable thin film will be excellent.

Figure 13:
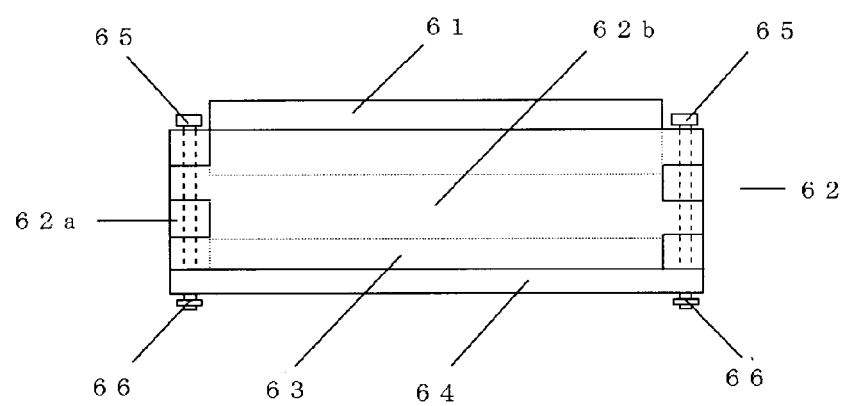
FIG. 13 is a side view of still another embodiment of the molding die of the present invention.

More specifically, for example, the raw material powder obtained as described above is filled in the molding die and formed into a green body by cold isostatic pressing. The molding die has, for example as shown in FIG. 1, a structure comprising a knockdown mold frame 2 composed of plural frame members 2a, 2b, an upper punch 1 freely movable along the inner surface of the knockdown mold frame 2, and a bottom plate 3 provided in contact with the knockdown mold frame 2, and designed to press mold a raw material powder between the upper punch 1 in the mold frame and the bottom plate 3. At least some of the frame members 2b constituting the knockdown mold frame 2 have, at their both ends, steps 7 to let the frame members abut against each other to prevent the shape of the opening of the knockdown mold frame from becoming smaller than the prescribed shape. Thus, by using an isostatic press, it is possible to relatively easily isotropically control the expansion by spring back of the green body different as between the pressing axial direction and the direction perpendicular thereto. However, the applied hydrostatic pressure is exerted to the green body via the molding die, and accordingly, when a member or structure to spontaneously generate a pressure (such as an elastic force) is employed for the molding die, even if the pressure exerted to the molding die is isotropical, the pressure exerted to the green body in the molding die will not be applied isotropically, whereby it is impossible to resolve the stress due to spring back. Therefore, it is preferred that the molding die for isostatic pressing is constituted by a rigid body substantially free from elastic deformation. Further, the structure of the steps, etc. formed in the frame members to maintain the shape of the opening of the knockdown mold frame 2 so that it will not become smaller than the prescribed shape, may be any structure, so long as it can maintain the shape of the opening so that it will not become smaller than the prescribed shape. For example, as shown in FIG. 1, the steps may be formed at both ends of either one of the frame members 2a and 2b, or a step may be formed at one end of each of the frame members 2a and 2b. Further, the structure of a step may be a simple step 7 as shown in FIG. 1, or for example, as shown in FIG. 13, it may be one wherein convex portions and concave portions may alternatively be formed in the direction of the height of the frame members (the depth of the compartment to be filled with the raw material powder) and they are engaged with each other.

Figure 2:
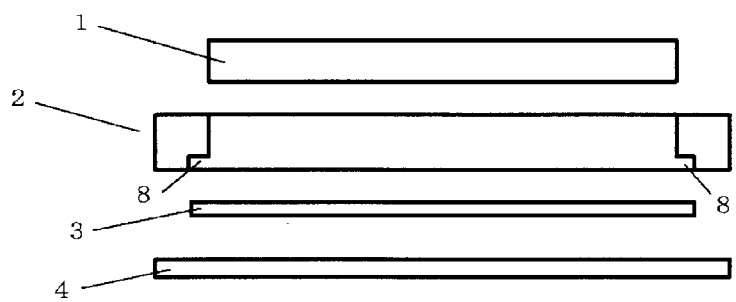
FIG. 2 is a cross-sectional view (side view) showing an embodiment of the molding die of the present invention as disassembled.

Further, it is preferred that the bottom plate 3 is constructed so that it is not movable along the inner surface of the knockdown mold frame 2. Namely, it is preferred that as shown in FIG. 2, steps 8 are formed at bottom portions of the frame members 2a and 2b constituting the knockdown mold frame, which engage with the bottom plate 3, or as mentioned hereinafter, a pedestal larger than the shape of the opening of the knockdown mold frame is provided. The bottom plate 3 is thereby prevented from moving upwardly along the inner surface of the knockdown mold frame 2. The steps 8 at the bottom of the frame portions 2a and 2b will play a role to prevent leakage of the raw material powder from the mold at the time of filling the raw material powder and at the same time provides a function to maintain the shape of the opening of the knockdown mold frame to be constant.

The method for preparing the above steps in the frame members constituting the knockdown mold frame is not particularly limited. They may be prepared by cutting a plate material, or they may be prepared by bonding two plates having different length by e.g. an adhesive. Either method is simple and economical with a low cost as compared with processing by a die in a pressing method or by a casting mold in a casting method.

The above molding die may be held on a pedestal 4. The pedestal 4 is set below the knockdown mold frame 2 and the bottom plate 3, and the bottom plate 3 and the pedestal 4 may be bonded by an adhesive or a two-sided adhesive tape. The pedestal 4 not only facilitates a handling operation such as relocation or transportation of the molding die, but also plays a role as a guide to smoothly move in parallel the frame members 2a and 2b constituting the knockdown mold frame 2 when the green body expands by spring back. The pedestal 4 and the bottom plate 3 may, of course, be made to be integral.

In order to maintain the shape of the opening of the assembled knockdown mold frame 2, the engaging portions of the frame members 2a and 2b constituting the knockdown mold frame 2 may be temporarily fixed by e.g. an adhesive tape. By such temporary fixing, the shape of the opening of the knockdown mold frame 2 will be stably maintained at the time of filling the raw material powder, whereby the filling operation will be facilitated. The material to be used for such temporary fixing is not particularly limited so long as it is capable of maintaining the shape at the time of filling the raw material powder and it will easily be elongated, broken or peeled at the time of spring back of the green body, not to prevent movement of the frame members 2a and 2b constituting the knockdown mold frame 2. However, an adhesive tape or the like is preferred. Otherwise, temporary fixing may also be made by winding a rubber band or the like having a proper binding force around the knockdown mold frame 2.

It is so designed that the clearance between the inner surface of the knockdown mold frame 2 and the side surface of the upper punch 1 is larger than 0 mm in a state where the shape of the opening has the prescribed size defined by the knockdown mold frame 2 and the bottom plate 3. In order to let the upper punch 1 move smoothly, such a clearance is preferably set to be from 0.1 mm to 2 mm, more preferably from 0.1 mm to 1 mm. If such a clearance is larger than 2 mm, the strength of the green body at a portion corresponding to the portion of the clearance between the knockdown mold frame 2 and the upper punch 1 may decrease, and cracking or peeling of the green body is likely to occur. On the other hand, if it is less than 0.1 mm, when the knockdown mold frame is deformed by the hydrostatic pressure, it is possible that the clearance between the upper punch and the knockdown mold frame decreases to hinder the sliding movement of the upper punch.

In order to improve the sliding performance of the upper punch 1, a material having a small friction coefficient may be applied or coated on the inner surface of the knockdown mold frame 2 and/or on the side surface of the upper punch 1. Otherwise, a tape having such a material applied or coated, may be bonded. The material to be applied or coated, is not particularly limited so long as its friction coefficient is smaller than the friction coefficient of the knockdown mold frame 2 or the upper punch 1. However, Teflon (registered trademark) or DLC (diamond like carbon) is preferred.

The material for the knockdown mold frame 2, the upper punch 1 or the bottom plate 3 is not particularly limited so long as its deformation is substantially little at the time of pressing by a cold isostatic press, but as a metal, aluminum, duralumin, super duralumin, stainless steel or tool steel may, for example, be preferred. As a resin, a plate material of e.g. MC nylon, ABS or bakelite may be used. The molding die of the present invention has such a construction that the shape of the opening of the knockdown mold frame 2 is defined by the knockdown mold frame 2 and the bottom plate 3. Therefore, in order to let the upper punch 1 move more smoothly, the bottom plate 3 is more preferably made of a material having a compressibility smaller than the upper punch 1. More preferably, the bottom plate 3 is made of a metal having a small compressibility, and the upper punch 1 is made of a resin having a compressibility larger than the metal. It is thereby possible to sufficiently secure a clearance between the upper punch 1 and the knockdown mold frame 2 during isostatic pressing, and the upper punch will be more smoothly movable.

Usually, when the pressing pressure becomes 200 kg/cm$^2$ or more, the powder is compacted to form a green body. In the isostatic pressing, the pressure is further increased to a level of 0.5 ton/cm$^2$ or more in order to further increase the density of the green body. The frame members of the knockdown mold frame are engaged with one another with the stepped portions at their both ends, whereby the center portions rather than the end portions of the frame members tend to be pushed and deformed by the hydrostatic pressure. The deformation degree is larger as the hydrostatic pressure is higher, and if the pressure reaches a certain level, the deformation tends to be larger than the clearance between the upper punch and the knockdown mold frame, whereby the upper punch will be in contact with the frame members, and its movement will be hindered by the friction. Consequently, the upper punch will be pressed more strongly at the center portion of the pressed surface than edge portions in contact with the frame members and deformed to cause a non-uniform force exerted to the green body once formed and to cause cracking. This problem may be solved by taking the above clearance between the frame members and the upper punch to be wide from the beginning. However, if such a clearance is made to be 2 mm or more, the green body at the clearance portion between the upper punch and the knockdown mold frame will not be substantially pressed by the upper punch, and the strength of the green body tends to be weak.

On the other hand, in a case where the compressibility of the bottom plate is smaller than the compressibility of the upper punch, the shape of the opening will be maintained to be wide as the bottom plate will be in contact with the frame members to define the shape of the opening of the knockdown mold frame, and the clearance between the upper punch and the frame members will be maintained as the upper punch will shrink more than the bottom plate. Consequently, molding free from cracking will be possible even in the high pressure isostatic press molding.

The height of the knockdown mold frame is not particularly limited so long as it is at least a value obtained by calculation from the intended thickness and density of the green body and the density of the raw material powder. However, the height of the knockdown mold frame is preferably made to be at least such a calculated value, so that it can be ascertained that the upper punch is certainly inserted in the mold frame, at the time of placing the upper punch on the raw material powder after filling the raw material powder in a space defined by the bottom plate and the inner surface of the mold frame.

Further, the thickness of the frame members constituting the knockdown mold frame is not particularly limited. However, for the purpose of minimizing the deformation by the hydrostatic pressure, the thicker the better. However, as the thickness increases, the weight of the molding die tends to be heavy, and the handling tends to be difficult. Therefore, the thickness is usually preferably from 1 cm to 10 cm, although it depends also on the size of the knockdown mold frame.

The thickness of the bottom plate is not particularly limited. However, as the thickness increases, the deformation by the pressure to be received from the knockdown mold frame tends to be small, and as the thickness increases, it tends to be heavy, and the handling tends to be difficult. Therefore, its thickness is preferably from 0.5 cm to 10 cm, although it depends also on the size of the knockdown mold frame.

The thickness of the upper punch is not particularly limited so long as it is not deformed. However, for the parallel movement along the inner surface of the knockdown mold frame, the thicker the better. Therefore its thickness is preferably 1 cm or more, although it depends also on the size of the knockdown mold frame.

The thickness of the pedestal is not particularly limited so long as it is a thickness whereby the handling is easy.

After filling the raw material powder, the molding die filled with the raw material powder is put in e.g. a plastic bag, followed by vacuum packing. In order to prevent the plastic bag from being drawn into the clearance of the molding die and ruptured at the time of isostatic pressing, a cushion may be provided around or on a part of the molding die. The material for the cushion is not particularly limited, but a rubber sheet, a rubber plate, a resin sheet, a resin plate or paper may, for example, be preferred. For a safety measure against leakage of water, the vacuum packing with a plastic bag may be repeated a few times.

The molding die thus prepared is put in a cold isostatic press, and molding is carried out under high pressure. The molding pressure at that time is not particularly limited so long as it is a pressure whereby a green body can be obtained. As the pressure is higher, the strength of the green body increases. Therefore, the pressure is preferably 0.5 ton/cm$^2$ or more, more preferably 1 ton/cm$^2$ or more.

In the molding die of the present invention, the frame members constituting the knockdown mold frame are not fixed to one another, so that the green body is able to expand without being restricted by the knockdown mold frame at the time of releasing the pressure after completion of the isostatic pressing, whereby breakage of the green body can be prevented. The molding die of the present invention is capable of completely relaxing the stress due to spring back of the green body. Therefore, even in the case of a green body using a raw material powder wherein no molding aid such as a binder is incorporated, or the amount of such an additive is 0.6 wt % or less, or in the case of a large-sized green body with substantial spring back, it is possible to form a green body excellent in shape accuracy without breakage or cracking.

Namely, the molding die of the present invention is a molding die for compression molding which is capable of forming a green body excellent in shape accuracy, like uniaxial pressing, without breakage by spring back of the green body.

On the other hand, in the case of a thick green body, usually it tends to be difficult to uniformly press the green body to the interior and accordingly tends to be difficult to obtain a uniform sintered body. Further, in a case where a sintering aid such as a binder is added, as the thickness of the green body increases, removal of the organic substance in the degreasing step tends to be difficult, and in order to reduce carbon remaining in the sintered body, it is preferred to limit the addition of the sintering aid to a small amount or not to add it at all. In the present invention, by using the isostatic press, it is possible to apply a large pressure also to a large-sized green body, and sufficiently uniform molding will be possible even for a thick green body. In order to obtain a further uniform green body, it is important to carry out pressing under a large pressure in the primary molding, and particularly, in order to obtain a dense and uniform green body by crushing agglomerated powder or granulated granules, it is effective to carry out uniaxial pressing rather than isotropical pressing. For example, as in Example 9, when a primary green body is pressed uniaxially under a pressure of 1 ton/cm$^2$, a dense uniform green body will be obtained, and the density distribution (the fluctuation in the sintered density) of the sintered body will be 0.06%. Whereas, even when the same sintered density may be obtained, if the primary molding is carried out by uniaxial pressing under a low pressure of 300 kg/cm$^2$, followed by isotropic pressing under a pressure of 1 ton/cm$^2$ as the secondary forming, pores due to inadequate crushing of the powder will remain in the green body, thus leading to a non-uniform green body, whereby the density distribution (the fluctuation in the sintered density) will be large at a level of 0.18%. Accordingly, in the present invention, by using an isostatic press capable of uniaxial pressing, as compared with uniaxial pressing using e.g. a hydraulic press machine, uniaxial pressing under a large pressure is possible by primary molding even for a green body with a large area, and it becomes possible to obtain a dense and uniform green body. Further, in a case where molding is carried out under such a large pressure, spring back which takes place at the time of releasing the pressure, will also be very large. However, according to the present invention, the stress due to such spring back can effectively be resolved, and even in the preparation of a sintered body having a thickness of 10 mm or more, more preferably 12 mm or more, where complete degreasing tends to be difficult, adequately uniform molding can be carried out, and it is possible to obtain a uniform sintered body wherein the sintered density is 90% or more, preferably 95% or more, more preferably 99% or more and the fluctuation in the sintered density (the difference in the sintered density between the largest portion and the smallest portion) is 0.2% or less. Further, in the present invention, it is possible to carry out the molding under a high pressure, whereby a green body having a sufficient strength can be obtained. Therefore, the amount of a sintering aid such as a binder to be added may be minimized, or no such a sintering aid may be added, whereby the amount of carbon remaining in the sintered body can be made to be less than 0.005 wt %, preferably 0.003 wt % or less, more preferably 0.002 wt % or less. Further, in a case where a sintering aid such as a binder is to be added, the amount is made to be preferably 0.6 wt % or less, more preferably 0.3 wt % or less, based on the raw material powder.

Further, it is known that the sintered density of a sputtering target to be used is influential over the abnormal electrical discharge or formation of nodules in sputtering. However, by controlling the fluctuation in the sintered density of the sputtering target to be 0.2% or less, a constant discharge can be maintained, and film deposition by sputtering can be constantly carried out.

For the same reason as above, according to the present invention, it is possible to obtain a sintered body which is a large-sized sintered body wherein one or more flat surface areas constituting the surface of the sintered body are 600 cm$^2$ or more, more preferably 1,000 cm$^2$ or more, more preferably 3,000 cm$^2$ or more, and which is a uniform sintered body wherein the sintered density of the entire sintered body is 90% or more, preferably 95% or more, more preferably 99% or more, and the fluctuation in the sintered density (the difference in the sintered density between the largest portion and the smallest portion) is 0.2% or less. Further, it is possible to obtain a sintered body which is a large-sized high density sintered body wherein one or more flat surface areas constituting the surface of the sintered body are 600 cm$^2$ or more, more preferably 1,000 cm$^2$ or more, more preferably 3,000 cm$^2$ or more, and which is a uniform sintered body with little residual carbon wherein the amount of the carbon remaining in the sintered body is less than 0.005 wt %, preferably 0.003 wt % or less, more preferably 0.002 wt % or less.

Further, according to the present invention, for the same reason as above, with respect to a sintered body having a rectangular parallelepiped shape wherein the area of the largest surface among surfaces constituting the surface of the sintered body is 1,000 cm$^2$ or more, and the ratio in length of the longest ridge to the shortest ridge is 40 or more, in the same manner as above, it is possible to obtain a sintered body wherein the sintered density of the entire sintered body is 90% or more, preferably 95% or more, more preferably 99% or more, and the fluctuation in the sintered density in the sintered body is 0.2% or less.

Further, according to the present invention, also for a high efficiency target having the efficiency in the use of the material in sputtering improved by increasing the thickness of the sintered body in an erosion region, it is possible to obtain a large high density sintered body by devising the shape of the punch or the bottom plate for the same reason as described above.

Figure 6:
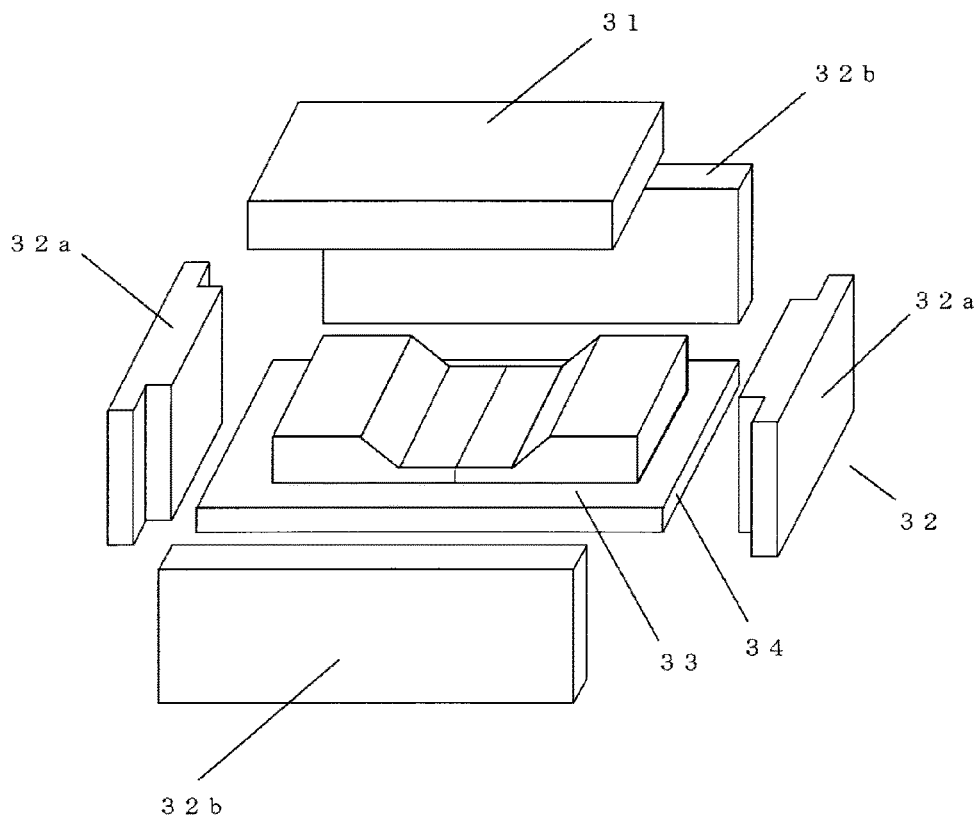
FIG. 6 is a perspective view schematically showing another embodiment of the molding die of the present invention as disassembled.

For example, as shown in FIG. 6, by using a molding die having a bottom plate 33 composed of bottom plate members 33a and 33b, it is possible to obtain a large green body having a convex portion on the sputtering surface. At that time, according to the present invention, by using a bottom plate divided into a plurality of bottom members in addition to the use of the knockdown mold frame, it is possible to effectively resolve the stress exerted to the convex portion of the green body by spring back which takes place at the time of reducing the pressure after the molding, whereby molding under a high pressure is possible, and it becomes possible to produce a large high density sintered body which is uniform and has little residual carbon.

Figure 7:
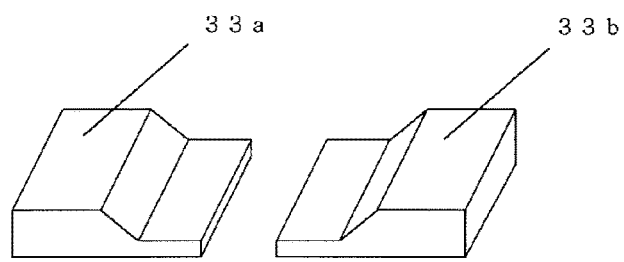
FIG. 7 is a perspective view showing an embodiment of the bottom plate of the molding die of the present invention as disassembled.
Figure 8:
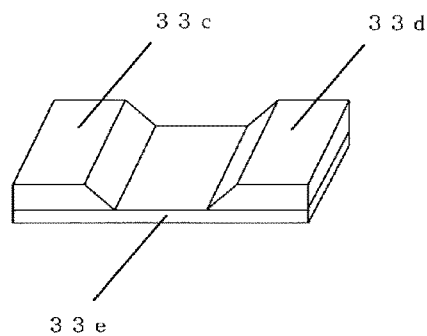
FIG. 8 is a perspective view showing another embodiment of the bottom plate of the molding die of the present invention.

Further, the bottom plate to form a convex portion of the sputtering surface may be any so long as it has a structure whereby it is movable to accommodate an expansion of the convex portion of the green body. For example, in addition to the one divided into two as shown in FIG. 7, it may be one divided into three bottom plate-constituting members 33c, 33d and 33e as shown in FIG. 8.

Figures 11A, 11B:
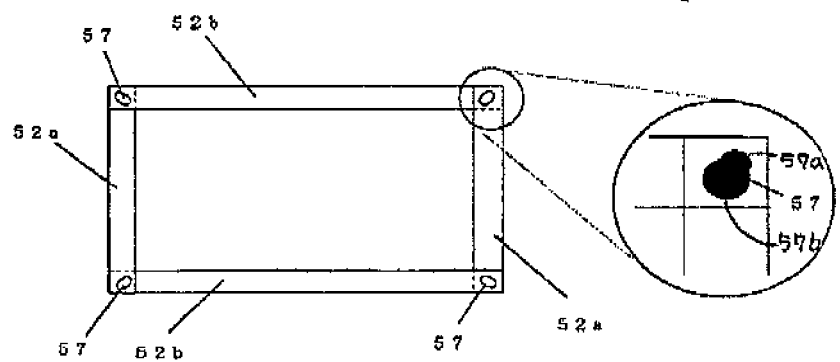
FIG. 11(a) is a plan view showing a knockdown mold frame.
FIG. 11(b) is an enlarged view showing the shape of a bolt-insertion hole at a corner portion of the knockdown mold frame.
Figure 12:
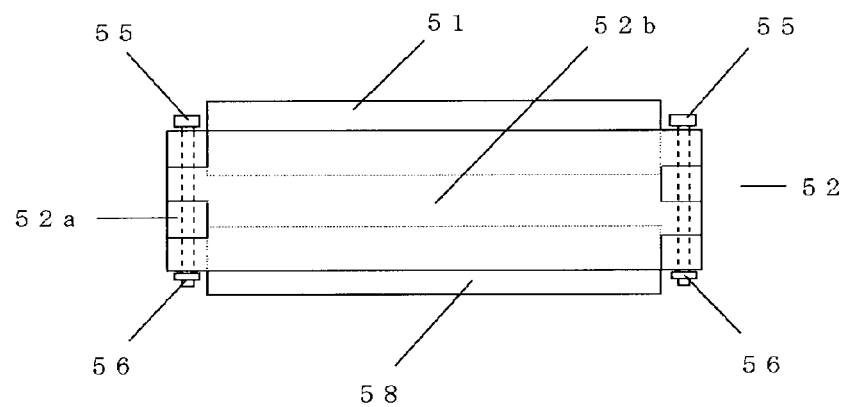
FIG. 12 is a side view of another embodiment of the molding die of the present invention.

A second embodiment of the molding die of the present invention is a molding die shown, for example, in FIGS. 11 and 12 and has such a construction that at both ends of the frame members 52a and 52b constituting the knockdown mold frame 52, pin-shaped connecting members (bolts 55) are inserted for fixing, whereby the shape of the knockdown mold frame can be maintained. Here, the structure comprising the connecting members to connect the knockdown mold frame, so-called pin-shaped connecting members, and connecting member-insertion portions into which the connecting members are inserted, is a structure to prevent the knockdown frame members 52a and 52b from moving inwardly from prescribed positions and to permit them to move outwardly to some extent, and it has a movable region 57b to permit a connecting member 55 to move. For example, it may be one having such a construction that pins are inserted at the connection portions of the knockdown mold frame, or one having such a construction that the connection portions of the knockdown mold frame are connected in a snap-fit manner and having such a construction that the frame members are outwardly slidable by virtue of convexes and concaves provided for such snap-fit engagement of the respective adjacent frame members. However, the shapes and structures of such members are not limited to such examples. Further, it is preferred that at the ends of the knockdown frame members into which pins are inserted, holes (bolt-insertion holes 57) larger than the diameter of the pins are provided to take a structure whereby the pins are movable. By adopting such a structure, it is possible to effectively resolve the stress due to spring back which takes place at the time of reducing the pressure after completion of pressing, which used to be a cause for breakage of the green body in a conventional method. The connecting member-insertion portion (bolt-insertion hole 57) into which the connecting member is inserted preferably has a diameter larger by from 2 mm to 10 mm than the diameter of the pin to relax the expansion due to spring back of the green body. The hole preferably has a shape close to oval and has a diameter substantially equal to the diameter of the pin at the region 57a to fix the pin. However, the shape and size of the hole are not limited thereto, since it is required only to secure the clearance to permit spring back at the time of expansion of the green body. Further, the pin is preferably a screw type and is one made of a material having a strength to maintain the knockdown mold frame, and its diameter is preferably from 1 mm to 100 mm, more preferably from 3 mm to 30 mm. However, the shape and material of the pin are not limited thereto. Such a knockdown mold frame can be made to have such a construction that at the time of filling the raw material powder, the knockdown mold frame is fixed by such pin screws to improve the operation efficiency, and after the filling operation, a rubber band having a proper binding force is wound around the knockdown mold frame to fix the knockdown mold frame, and then the pin screws are loosened so that the frame members may smoothly be movable at the time of expansion of the green body due to spring back at the time of the molding. By adopting the knockdown mold frame having such movable pins, it is possible that at the time of filling the powder, a function to prevent leakage of the raw material powder from the mold can be added by tightening the screws to fix the knockdown mold frame, and after filling the powder, the pin screws are loosened to facilitate smooth movement of the frame members to provide a function of relaxing the spring back of the green body to prevent breakage of the green body.

As a specific embodiment of the above-described molding die, a molding die shown in FIGS. 11 and 12 may, for example, be mentioned. In this molding die, a knockdown mold frame 52 is composed of plural frame members 52a and 52b and has such a construction that the frame members 52a and 52b are movable to accommodate expansion of the green body which takes place at the time of reducing the pressure after completion of the pressing, and it has a fixing mechanism, for example, such that the frame members 52a and 52b have, at their both ends, connecting member-insertion holes (bolt-insertion holes) 57, and bolts 55 are inserted into the bolt-insertion holes 57 and tightened by nuts 56 to maintain the shape of the opening of the knockdown mold frame 52. Such bolt-insertion holes are formed to be larger than the diameter of the bolts 55 to be inserted, as shown in FIG. 11(b), and if tightening by the nuts 56 is loosened, the frame members 52a and 52b may be made to be movable to accommodate an expansion of the sintered body which takes place at the time of reducing the pressure after completion of press molding.

In a specific operation procedure, the knockdown mold frame 52 is assembled, then bolts 55 are inserted into bolt-insertion holes 57 and tightened by nuts 56 for fixing, whereby it becomes possible to easily carry out the operation such as filling the raw material powder. After filling the raw material powder, an upper punch 51 is placed on the raw material powder, a rubber band or the like having a proper binding force is wound around the knockdown mold frame 52, then the nuts 56 of the bolts 55 fixing the knockdown mold frame 52 are loosened to make the frame members 52a and 52b relatively movable. Then, a rubber sheet as a cushion is put on the upper punch to cover the clearance between the upper punch 51 and the knockdown mold frame 52, and the assembly is put in a plastic bag, the interior of the bag was evacuated to carry out vacuum packing, followed by cold isostatic pressing to prepare a green body.

Here, the bolt-insertion holes 57 are formed to be sufficiently larger than the diameter of the bolts 55 so that the frame members 52a and 52b are freely movable to accommodate an expansion of the green body which takes place at the time of reducing the pressure after completion of the pressing. It is particularly preferred to form the holes to have a shape elongated in a diagonal line direction of the shape of the opening of the knockdown mold frame 52, as shown in FIG. 11(b).

Further, it is preferred to provide an elastic body of e.g. rubber along the peripheral wall at the region 57a (the initial position of the connecting member) of such a bolt-insertion hole 57 wherein the connecting member (bolt) 55 is present when the shape of the opening of the knockdown mold frame is in the smallest state, so that at the time of e.g. vacuum packing after filling the raw material powder, the knockdown mold frame 52 is maintained in such a state with a proper strength and at the time of reducing the pressure after completion of pressing, the connecting member (bolt) 55 will move to the movable region 57b for the connecting member to accommodate the expansion of the green body. At that time, as shown in FIG. 11(b), it is preferred to form a constriction at the boundary between the initial position 57a of the connecting member and the movable region 57b for the connecting member, in the bolt-insertion hole 57. By adjusting the size of such a constriction or the strength, thickness or the like of the elastic body, it is possible to make the bolt 55 smoothly movable to the movable region 57b for the connecting member at the time of reducing the pressure after completion of the pressing, and it is possible to make the movement of the frame members 52a and 52b more smoothly, and it is possible to further suppress formation of cracks or warpage.

In the above embodiment, the lower punch 58 is movable up and down in the knockdown mold frame, as is evident from FIG. 12. However, by providing a pedestal 64 having a shape larger than the shape of the opening of the knockdown mold frame as shown in FIG. 13, it is possible to limit the up and down movement of the bottom plate 63 in the knockdown mold frame 62, and movement of the frame members 62a and 62b is made smooth, whereby the operation may be made to be more stable, and further it is possible to suppress formation of cracks or warpage. Further, by providing such a pedestal 64, it becomes possible to remarkably improve the operation efficiency such as filling of the raw material powder or transportation of the molding die.

Further, as regards the material constituting this molding die and the structure, etc. for imparting additional functions, what has been described above with respect to the first embodiment of the molding die of the present invention as shown in FIG. 1 is likewise applicable to this second embodiment of the molding die.

The green body obtained as described above is fired in a firing furnace to obtain a sintered body. The conditions such as the sintering temperature, the temperature-raising rate and the temperature-lowering rate vary depending upon various materials. However, in the case of ITO, for example, the firing temperature is preferably from 1,400° C. to 1,600° C. at which the solid solubility of tin oxide in indium oxide will be accelerated. If it is lower than 1,400° C., sintering as ITO tends to be incomplete, whereby the strength of the sintered body tends to be low. On the other hand, at a temperature exceeding 1,600° C., evaporation of indium oxide or tin oxide from the sintered particles of ITO tends to be remarkable, thus leading to a problem of e.g. a compositional deviation. The temperature-raising rate to the firing temperature is preferably from 20° C./hr to 200° C./hr when shrinkage due to uniform sintering of the green body is taken into consideration. The temperature-lowering rate to room temperature after the temperature was maintained at the firing temperature, is preferably 200° C./hr or less with a view to preventing formation of cracks or warpage by reducing a thermal shock to the sintered body.

As mentioned above, in the present invention, a molding aid such as a binder to be added to the raw material powder is not required, or its amount can be limited to a very small amount. Accordingly, at the time of firing to carry out sintering, it is unnecessary to provide a firing step (degreasing step) intended to remove such a molding aid. In general, a temperature raise at a low rate at a low temperature as in the firing step intended to remove an organic substance in a green body, tends to lead to deterioration of a heater of a heating furnace, whereby the useful life of the heater will be shortened, and the production cost will be increased. Besides, it is necessary to raise the temperature at a low rate of 10° C./hr or less from room temperature to 400° C. or 600° C., in order not to form cracks in the sintered body due to combustion or decomposition of an organic component, whereby the time for the production of the sintered body will be substantially increased. Therefore, according to the present invention which requires no firing step intended to remove an organic substance in a sintered body, it is possible to remarkably improve the production efficiency of the sintered body. Here, in order to make it unnecessary to provide a firing step intended to remove an organic substance in a green body, it is, of course, advisable not to add a molding aid containing an organic substance, and such can be attained by controlling the content of an organic substance in the raw material powder to be 0.6 wt % or less, preferably 0.3 wt % or less.

The sintered body produced by the above method has a good shape accuracy, and it can be easily ground into a desired shape, and it is easily made into a sputtering target.

On the other hand, the first embodiment of the sintered body of the present invention is a sintered body containing no carbon as a constituting element, which is characterized in that the amount of carbon contained as an impurity in the sintered body is small. When a sintered body having a large amount of carbon is employed, for example, in the case of an ITO target, such will not only cause abnormal electrical discharge but also change the etching rate of the obtainable thin film. Further, in the case of an AZO target, the resistance of the obtainable transparent conductive film will increase. Therefore, the content of carbon in a sintered body is preferably less than 0.005 wt %, more preferably 0.003 wt % or less, further preferably 0.002 wt % or less, whereby no influence over such characteristics will be observed.

The carbon present in a sintered body is derived mainly from an organic substance such as a dispersant or defoaming agent for slurrying to be used in the process for the production of a sintered body, or a binder or a lubricant used for molding of a powder, which will remain without being completely removed in a degreasing step. Therefore, in a case where the size of the green body is large, or the thickness is thick, particularly, degreasing tends to be incomplete, and carbon remaining in the sintered body tends to be large in amount. Such influence tends to be remarkable with one having a sintered body size of 600 cm$^2$ or more, more remarkable with one having a size of 1,000 cm$^2$ or more. With respect to the thickness, such influence tends to be remarkable with one having a thickness of 10 mm or more, more remarkable with one having a thickness of 12 mm or more. Further, in a case where the size of the green body is large, or the thickness is thick, molding tends to be particularly difficult, and it is common to employ a molding aid or powder granulation employing a slurry, which causes an increase of the residual carbon. However, by obtaining a green body by molding a raw material powder directly by cold isostatic pressing using the molding die of the present invention, it is possible to produce a large high density sintered body having a thickness of 10 mm or more or a size of 600 cm$^2$ or more, preferably 1,000 cm$^2$ or more, more preferably 3,000 cm$^2$ or more, without using a molding aid or powder granulation using a slurry or by using a raw material powder having a small amount of a molding aid containing an organic substance.

Especially, in the present invention, as mentioned above, by using a cold isostatic press, it is possible to carry out molding under a high pressure even for a large-sized sintered body, and it is possible to effectively release the stress due to spring back of the green body which takes place at the time of reducing the pressure after completion of the press molding, whereby it is possible to prepare a green body having a sufficient strength even without using a molding aid such as a binder containing an organic substance to be added to a raw material powder at all, or even by an addition of a small amount at a level of 0.6 wt % or less or 0.3 wt % or less to the raw material powder, and it is possible to obtain a large high density and uniform sintered body with little residual carbon. And the obtained sintered body is shaped into a desired shape, if necessary, the surface of the sintered body is ground or polished, and then if necessary bonded to a backing plate to prepare a sputtering target, whereby a transparent conductive film with a low resistance can be formed at a high speed, and it is possible to provide a sputtering target, whereby formation of nodules or abnormal electrical discharge during the sputtering is little.

Further, Patent Document 1 discloses that it is possible to reduce formation of nodules or abnormal electrical discharge during the sputtering with an ITO target by controlling elements belonging to Groups IIIb and IVb in the Periodic Table contained in the target to be 50 ppm or less. However, with respect to the influence of carbon, nothing specific is mentioned. In fact, in this Patent Document 1, an Example wherein an ITO green body formed by an addition of a binder is fired on an ITO sintering plate, is compared with a Comparative Example wherein the same green body is fired on a low purity alumina plate (containing 7% of $SiO_2$), and thus it is intended to substantially reduce impurities of Al and Si which are included as dispersed from the setter during the firing. Namely, this Patent Document 1 discloses no specific data showing the relation of the presence of carbon with formation of nodules or abnormal electrical discharge during the sputtering or discloses nothing about what action is involved in the relation of the presence of carbon with formation of nodules or abnormal electrical discharge during the sputtering. Further, in an Example in the Patent Document 1, 1 wt % of PVA is added as a binder to a raw material powder at the time of molding, and the obtained sintered body is considered to contain carbon at a level of 50 ppm. Further, according to a result of a study by the present inventors, in a case where a molding aid such as a binder containing an organic substance is used as in this Patent Document 1, it is observed that carbon remaining in the sintered body can not necessarily be completely removed by usual degreasing treatment of heating at a temperature of from about 300 to 600° C., and in this Patent Document 1, nothing is considered in this regard.

A second embodiment of the sintered body of the present invention is a sintered body which is characterized in that the area of the largest surface among surfaces constituting the surface of the sintered body is 1,000 cm$^2$ or more, and the sintered density of the entire sintered body is 90% or more, preferably 95% or more, more preferably 99% or more, and it is preferably a sintered body wherein the fluctuation in the sintered density is 0.2% or less. This sintered body is also obtainable by carrying out molding by cold isostatic pressing using the molding die of the present invention. Namely, even without using a molding aid such as a binder or lubricant containing an organic substance to be added to a raw material powder at all, or even by an addition of a very small amount such as an organic content of 0.6 wt % or less, preferably 0.3 wt % or less, in the raw material powder, it is possible to prepare a green body having a sufficient strength, and it is thereby possible to produce the above-mentioned large high density sintered body with little residual carbon and with a small fluctuation in the density in the sintered body. It is thereby possible to provide a large high performance sputtering target which is required along with the trend for large sizes of e.g. display devices.

A third embodiment of the sintered body of the present invention is one wherein a convex portion is formed on the sputtering surface of a sintered body to make the thickens of the erosion region to be thick thereby to improve the efficiency in the use of the target material. For a sputtering target of such a shape, a large high density sintered body with little residual carbon and with a small fluctuation in the density within the sintered body, can be produced by constituting the bottom plate having a concave portion by plural bottom plate-constituting members and using the molding die of the present invention. In the case of an ITO target or the like, it is thereby possible to remarkably improve the efficiency in the use of the expensive target material, and it is possible to obtain an excellent large target whereby a thin film having a low resistance can be obtained, and formation of nodules or abnormal electrical discharge is little.

EXAMPLES

Now, the present invention will be described in detail with reference to Examples, but the present invention is by no means restricted to such Examples.

Example 1

Figure 3:
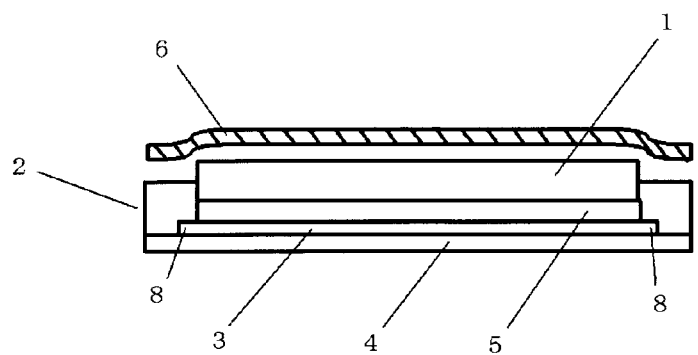
FIG. 3 is a cross-sectional view (side view) showing an embodiment of the molding die of the present invention.

As shown in FIGS. 1 to 3, the molding die used in this Example comprises an upper punch 1, a knockdown mold frame 2 composed of a frame member 2a and a frame member 2b, a bottom plate 3 and a pedestal 4. The upper punch is made of MC nylon; the knockdown mold frame 2 and the bottom plate 3 are made of SUS; and the pedestal 4 is made of MC nylon. The knockdown mold frame 2 is composed of the frame member 2a and the frame member 2b, and at both ends of the frame members 2b, stepped portions 7 are formed to engage with the frame members 2a. At the bottoms of the frame member 2a and the frame member 2b, stepped portions 8 are formed to engage with the bottom plate 3. It is thereby constructed so that the bottom plate 3 is prevented from moving along the side surface of the knockdown mold frame 2.

The clearance between the knockdown mold frame 2 and the upper punch 1 was 0.5 mm (the width and length of the upper punch 1 were smaller by 1.0 mm than the width and length of the shape of the opening, respectively) and further, a Teflon (registered trademark) tape was bonded to the inner side surface of the knockdown mold frame 2 and on the side surface of the upper punch 1 to reduce the friction.

The knockdown mold frame 2 and the bottom plate 3 were placed on the pedestal 4, and the pedestal 4 and the bottom plate 3 were firmly bonded by a two-sided adhesive tape. The engaged portion of the frame member 2a and the frame member 2b of the knockdown mold frame 2 was fixed by an adhesive tape (Scotch tape (registered trademark)) having a width of 1 cm, whereby a knockdown mold frame 2 was assembled.

2 wt % of an $Al_2O_3$ powder and 98 wt % of a ZnO powder were mixed in a dry ball mill to obtain a raw material powder 5, and 9.6 kg of the raw material powder was filled in a space defined by the bottom plate 3 and the knockdown mold frame 2 (shape of the opening: rectangular of 390 mm×770 mm) whereupon an upper punch 1 was placed on this raw material powder 5. No powder treatment such as granulation or addition of a binder was carried out. A rubber sheet was put as a cushion 6 on the upper punch so as to cover the clearance between the upper punch 1 and the knockdown mold frame 2, followed by putting in a plastic bag, and the interior of the bag was evacuated to carry out vacuum packing.

The molding die prepared in such a manner was put into a cold isostatic press, and molding was carried out under a pressure of 1 ton/cm$^2$. The obtained green body was taken out from the mold, and the shape was confirmed, whereby no cracking or warpage was observed, and a green body of 391 mm×773 mm×9.5 mm was obtained.

The above green body was set in a firing furnace, and firing was carried out under the following conditions to prepare a sintered body.

Firing Conditions
  Firing atmosphere: Atmospheric air
  Temperature-raising rate: 100° C./hr, firing temperature: 1,500° C., firing time: 5 hr
  Temperature-lowering rate: 100° C./hr The obtained sintered body had a size of about 328 mm×649 mm×8 mm, and the carbon content in the sintered body was 0.003 wt %. Further, the sintered density was 99.45% as a whole, and the difference in the sintered density between the largest portion and the smallest portion was 0.09%. Further, the true density of the sintered body was 5.632 g/cm$^3$.

Example 2

Using the same molding die as in Example 1 except that the upper punch 1, the knockdown mold frame 2 and the bottom plate 3 were made of MC nylon, it was put into a cold isostatic press in the same manner as in Example 1, and molding was carried out under a pressure of 1 ton/cm$^2$. The obtained green body was taken out from the mold, and the shape was confirmed, whereby no cracking or warpage was observed, and a green body of 391 mm×773 mm×9.5 mm was obtained. However, the strength of the portion of 2 mm or less from a corner of the green body was weaker than the strength of the green body obtained in Example 1 and such a portion was peeled when grasped strongly.

The obtained green body was fired in the same manner as in Example 1 to obtain a sintered body having a size of about 328 mm×649 mm×8 mm. The carbon content in the sintered body was 0.004 wt %. Further, the sintered density was 99.14% as a whole, and the difference in the sintered density between the largest portion and the smallest portion was 0.18%.

Example 3

Using the same molding die as in Example 1 except that the upper punch 1 was made of bakelite, the knockdown mold frame 2 and the bottom plate 3 were made of super duralumin, and the amount of the powder filled was changed to 14.5 kg, it was put into a cold isostatic press in the same manner as in Example 1, and molding was carried out under a pressure of 1 ton/cm$^2$. The obtained green body was taken out from the mold, and the shape was confirmed, whereby no cracking or warpage was observed, and a green body of 391 mm×773 mm×14 mm was obtained.

The obtained green body was fired in the same manner as in Example 1 to obtain a sintered body having a size of about 328 mm×649 mm×12 mm. The carbon content in the sintered body was 0.003 wt %. Further, the sintered density was 99.38% as a whole, and the difference in the sintered density between the largest portion and the smallest portion was 0.10%.

Example 4

Using the same molding die as in Example 1 except that the raw material powder was changed to a mixed powder comprising 10 wt % of a SnO$_2$ powder and 90 wt % of an In$_2$O$_3$ powder, and 17 kg of the powder was filled into the molding die, it was put into a cold isostatic press under the same conditions as in Example 1. No powder treatment such as granulation or addition of a binder was carried out. The obtained green body was taken out from the mold, and the shape was confirmed, whereby no cracking or warpage was observed, and a green body of 391 mm×773 mm×16 mm was obtained.

The above green body was set in a firing furnace, and firing was carried out under the following conditions to prepare a sintered body.

Firing Conditions
  Firing atmosphere: Oxygen flowing atmosphere
  Temperature-raising rate: 100° C./hr, firing temperature: 1,600° C., firing time: 5 hr
  Temperature-lowering rate: 100° C./hr The obtained sintered body had a size of about 307 mm×607 mm×13 mm, and the carbon content in the sintered body was 0.002 wt %. Further, the sintered density was 99.79% as a whole, and the difference in the sintered density between the largest portion and the smallest portion was 0.04%. Further, the true density of the sintered body was 7.156 g/cm$^3$.

Example 5

Using the same molding die as in Example 1 except that the raw material powder was an ITO powder obtained by firing and pulverizing a mixed powder comprising 10 wt % of a SnO$_2$ powder and 90 wt % of an In$_2$O$_3$ powder, and 17 kg of the powder was filled into the molding die, it was put into a cold isostatic press under the same conditions as in Example 1. The obtained green body was taken out from the mold, and the shape was confirmed, whereby no cracking or warpage was observed, and a green body of 391 mm×773 mm×15 mm was obtained.

Example 6

Using the same molding die as in Example 1 except that the upper punch 1 was made of bakelite, the knockdown mold frame 2 and the bottom plate 3 were made of super duralumin, the raw material powder was an ITO powder obtained by firing and pulverizing a mixed powder comprising 10 wt % of a SnO$_2$ powder and 90 wt % of an In$_2$O$_3$ powder, and 14.5 kg of the powder was filled into the molding die, it was put into a cold isostatic press under the same conditions as in Example 1. The obtained green body was taken out from the mold, and the shape was confirmed, whereby no cracking or warpage was observed, and a green body of 391 mm×773 mm×13 mm was obtained.

The obtained green body was fired in the same manner as in Example 4 to obtain a sintered body having a size of about 320 mm×630 mm×10 mm. The carbon content in the sintered body was 0.001 wt %. Further, the sintered density was 99.80% as a whole, and the difference in the sintered density between the largest portion and the smallest portion was 0.05%.

Example 7

A green body was prepared in the same manner as in Example 1 except that the raw material powder was a mixed powder comprising 10 wt % of a SnO$_2$ powder and 90 wt % of an In$_2$O$_3$ powder, 17 kg of such a powder was filled into the molding die, and the knockdown mold frame was assembled by binding the frame members by a rubber band instead of bonding an adhesive tape (Scotch tape (registered trademark)) at the engaged portion of the frame members. The shape of the obtained green body was confirmed, whereby no cracking or warpage was observed, and its size was 391 mm×773 mm×16 mm.

Example 8

A molding die was prepared in the same manner as in Example 1 except that the raw material powder was a mixed powder comprising 10 wt % of a SnO$_2$ powder and 90 wt % of an In$_2$O$_3$ powder, 11 kg of such a powder was filled into the molding die, the upper punch 1 was made of bakelite, the knockdown mold frame 2 and the bottom plate 3 were made of super duralumin, and the knockdown mold frame was assembled by binding the frame members by a rubber band instead of bonding an adhesive tape (Scotch tape (registered trademark)) at the engaged portion of the frame members. No powder treatment such as granulation or addition of a binder was carried out. The shape of the obtained green body was confirmed, whereby no cracking or warpage was observed, and its size was 391 mm×773 mm×10 mm.

The obtained green body was fired in the same manner as in Example 4 to obtain a sintered body having a size of about 307 mm×607 mm×8 mm. The carbon content in the sintered body was 0.001 wt %. Further, the sintered density was 99.82% as a whole, and the difference in the sintered density between the largest portion and the smallest portion was 0.04%.

Example 9

A green body was prepared in the same manner as in Example 1 except that the raw material powder was a mixed powder comprising 10 wt % of a $SnO_2$ powder and 90 wt % of an $In_2O_3$ powder, a molding die (shape of the opening: rectangular of 265 mm×390 mm) having a structure similar to the molding die of Example 1 although the size was different, was used, and 7.4 kg of the raw material powder was filled. The obtained green body was taken out from the mold, and the shape was confirmed, whereby no cracking or warpage was observed, and a green body of 265 mm×391 mm×20 mm was obtained.

A sintered body obtained by firing the obtained green body under the same conditions as in Example 4, had a size of about 208 mm×307 mm×16 mm, and the carbon content in the sintered body was 0.003 wt %. Further, the sintered density was 99.74% as a whole, and the difference in the sintered density between the largest portion and the smallest portion was 0.06%.

Example 10

A green body was prepared in the same manner as in Example 1 except that the raw material powder was a mixed powder comprising 10 wt % of a $SnO_2$ powder and 90 wt % of an $In_2O_3$ powder, and a molding die (shape of the opening: rectangular of 330 mm×5,200 mm) having a structure similar to the molding die of Example 1 although the size was different, was used, and 9.2 kg of the raw material powder was filled. The obtained green body was taken out from the mold, and the shape was confirmed, whereby no cracking or warpage was observed, and a green body of 331 mm×522 mm×15 mm was obtained.

A sintered body obtained by firing the obtained green body under the same conditions as in Example 4, had a size of about 260 mm×410 mm×12 mm, and the carbon content in the sintered body was 0.002 wt %. Further, the sintered density was 99.77% as a whole, and the difference in the sintered density between the largest portion and the smallest portion was 0.05%.

Example 11

Figure 4:
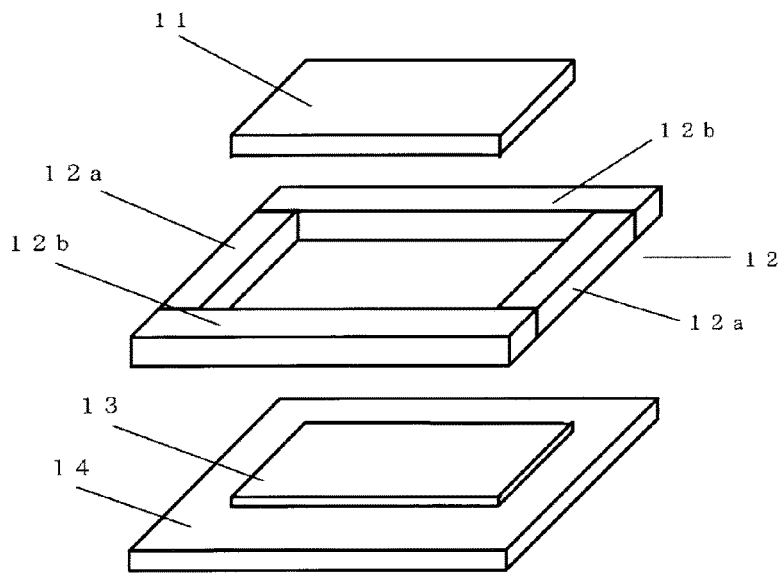
FIG. 4 is a perspective view schematically showing another embodiment of the molding die of the present invention as disassembled.

A molding die was put into a cold isostatic press under the same conditions as in Example 1 except that the same molding die as in Example 1 except that as shown in FIG. 4, no stepped portions were formed at the ends of the frame members 12b, and as the raw material powder, 17 kg of a mixed powder comprising 10 wt % of a $SnO_2$ powder and 90 wt % of an $In_2O_3$ powder, was filled. The obtained green body was taken out from the mold, and the shape was confirmed, whereby no cracking or warpage was observed, and a green body of 391 mm×773 mm×16 mm was obtained.

Comparative Example 1

2 wt % of an $Al_2O_3$ powder and 98 wt % of a ZnO powder were mixed by a dry ball mill to obtain a mixed powder, to which 2.0 wt % of a paraffin binder was added to prepare a raw material powder. 7.2 kg of this raw material powder was filled into a mold of 260 mm×850 mm, and press molding was carried out under a molding pressure of 300 kg/cm² to obtain a green body. Further, CIP treatment was carried out under a pressure of 1 ton/cm². Thereafter, in order to remove the binder remaining in the green body, the above green body was set in a firing furnace, and degreasing was carried out under the following conditions. Here, the size of the green body after the CIP treatment was 250 mm×815 mm×10 mm.

Degreasing Conditions
  Degreasing atmosphere: Atmospheric air flow atmosphere
  Degreasing temperature: 450° C., temperature-raising rate: 3° C./hr, retention time: 2 hr The obtained green body was fired in the same manner as in Example 1 to obtain a sintered body having a size of about 220 mm×309 mm×8 mm. The carbon content in the sintered body was 0.010 wt %. Further, the density (sintered density) of the sintered body was 99.33% over the entire sintered body, and the difference in the sintered density between the largest value and the smallest value among various portions of the sintered body was 0.24%. Further, the true density of the sintered body was 5.632 g/cm³.

Comparative Example 2

To a mixed powder comprising 10 wt % of a $SnO_2$ powder and 90 wt % of an $In_2O_3$ powder, 1.0 wt % of a polyvinyl alcohol binder and deionized water were mixed and subjected to wet system ball mill mixing to obtain a slurry, which was spray-dried to obtain a granulated powder. 4.2 kg of such a granulated powder was filled into a mold of 185 mm×415 mm, and press molding was carried out under a molding pressure of 300 kg/cm² to obtain a green body. Further, CIP treatment was carried out under a pressure of 1 ton/cm². Thereafter, in order to remove the binder remaining in the green body, the above green body was set in a firing furnace, and degreasing was carried out in the same manner as in Comparative Example 1. Here, the size of the green body after the CIP treatment was 168 mm×377 mm×17 mm.

The obtained green body was fired in the same manner as in Example 4 to obtain a sintered body having a size of about 137 mm×309 mm×13 mm. The carbon content in the sintered body was 0.008 wt %. Further, the density (sintered density) of the sintered body was 99.74% as the entire sintered body, and the difference in the sintered density between the largest value and the smallest value among various portions of the sintered body was 0.18%. Further, the true density of the sintered body was 7.156 g/cm³.

Comparative Example 3

To a mixed powder comprising 10 wt % of a $SnO_2$ powder and 90 wt % of an $In_2O_3$ powder, 1.0 wt % of a polyvinyl alcohol binder and deionized water were mixed and subjected to wet system ball mill mixing to obtain a slurry. To the obtained slurry, 0.1 wt % of a polyalkylene glycol defoamer was added, and defoaming treatment was carried out in vacuum. The defoamed slurry was injected into a casting mold of 420 mm×960 mm×11 mm, and cast molding was carried out under a molding pressure of 20 kg/cm$^2$ to obtain a green body. This green body was dried and then, CIP treatment was carried out under a pressure of 1 ton/cm$^2$. Thereafter, in order to remove the dispersing agent and binder remaining in the green body, the green body was set in a firing furnace, and degreasing was carried out in the same manner as in Comparative Example 1. Here, the size of the green body after the CIP treatment was 380 mm×870 mm×10 mm.

The obtained green body was fired in the same manner as in Example 4 to obtain a sintered body having a size of about 310 mm×710 mm×8 mm. The carbon content in the sintered body was 0.007 wt %. Further, the density (sintered density) of the sintered body was 99.76% as the entire sintered body, and the difference in the sintered density between the largest value and the smallest value among various portions of the sintered body was 0.21%.

Comparative Example 4

Figure 5A:
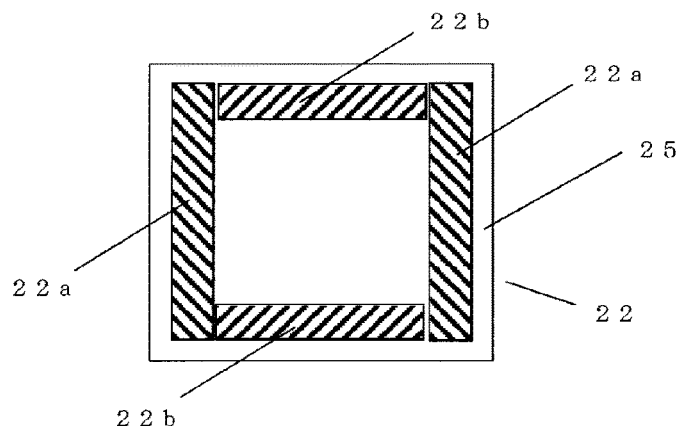
FIG. 5 is a cross-sectional view showing the molding die used in Comparative Example 4.
Figure 5B:
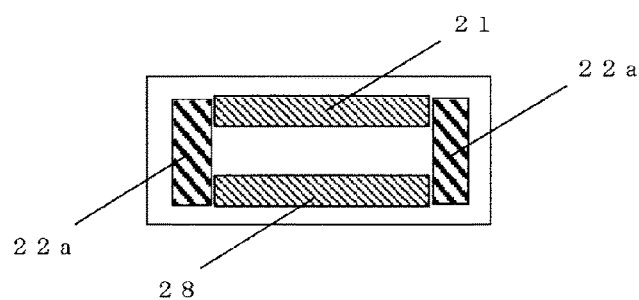

As shown in FIG. 5, a knockdown mold frame 22 composed of four divided SUS frame members 22a and 22b, and SUS upper punch 21 and lower punch 28, were disposed in an urethane rubber mold (hardness: 70°) 25, and into the space (shape of the opening: rectangular of 390 mm×770 mm), a mixed powder comprising 10 wt % of a SnO$_2$ powder and 90 wt % of an In$_2$O$_3$ powder, was filled. This molding die was put into a plastic bag, and the interior was evacuated to carry out vacuum packing, and then isostatic press molding was carried out in the same manner as in Example 1. After the pressing, a space was observed between the urethane rubber mold 25 and the upper punch 21, and the green body had a large crack in the longitudinal direction.

Ascertainment of Film Deposition

The sintered bodies obtained in Example 1 and Comparative Example 1 were subjected to grinding to prepare target materials of 4 inches in diameter×6 mm in thickness. Each target material was bonded by an indium solder to a backing plate made of oxygen-free copper to prepare a sputtering target. Using the sputtering target thus prepared, film deposition was carried out under the following sputtering conditions. The resistivity of the obtained thin film was measured by a four terminal method, whereby the resistivity of the thin film obtained by the target of Example 1 was 9.6×10$^{-4}$ Ωcm, and the resistivity of the thin film obtained by the target of Comparative Example 1 was 1.3×10$^{-3}$ Ωcm.

Sputtering Conditions
  DC power: 300 W
  Sputtering gas: Ar
  Gas pressure: 0.5 Pa
  Substrate temperature: 200° C.
  Film thickness: 100 nm
  Glass substrate: Corning #1737

Ascertainment of Electrical Discharge

The sintered bodies obtained in Example 8 and Comparative Example 2 were subjected to grinding to prepare target materials of 101.6 mm×177.8 mm×6 mm, and each target material was bonded by an indium solder to a backing plate made of oxygen-free copper to prepare a sputtering target. Using the sputtering target thus prepared, 20 kWh sputtering was carried out under the following sputtering conditions, whereby the number of times of abnormal electrical discharge was measured. The measurement of the number of times of abnormal electrical discharge was carried out under the following measuring conditions by means of a micro arc monitor (manufactured by LANDMARK TECHNOLOGY). The number of times of arcing was 283 times by the target of Example 8 and 364 times by the target of the Comparative Example 2.

Sputtering Conditions
  DC power: 300 W
  Sputtering gas: Ar+O$_2$
  Gas pressure: 0.5 Pa
Arcing Measurement Conditions
  Detecting voltage: 200 V
  Detecting time: 50 μsec Example 12

As shown in FIG. 6, the molding die used in this Example, comprises an upper punch 31, a knockdown mold frame 32 composed of frame members 32a and 32b, a bottom plate 33 having a concave portion and a pedestal 34. At both ends of a frame member 32a, stepped portions are formed to engage with end portions of frame members 32b to define the shape of the opening of the knockdown mold frame. The bottom plate 33 having a concave portion is composed of bottom plate-constituting members 33a and 33b as shown in FIG. 7. The upper punch 31 was made of bakelite, the frame members 32a and 32b and the bottom plate 33 were made of super duralumin, and the pedestal 34 was made of bakelite.

The clearance between the knockdown mold frame 32 and the upper punch 31 was made to be 0.5 mm. Namely, the width and length of the upper punch 31 were formed to be smaller by 1.0 mm from the width and length of the shape of the opening of the knockdown mold frame 32.

The molding die was stabilized by placing the knockdown mold frame 32 and the bottom plate 33 on the pedestal 34. Namely, by placing the knockdown mold frame on the pedestal 34, it is possible to let the frame members 32a and 32b move smoothly on the pedestal 34 to accommodate an expansion of the green body which takes place at the time of reducing the pressure after completion of the pressing, and at the same time, it is possible to prevent the movement in an up-and-down direction of the bottom plate 33 whose movement otherwise tends to be non-uniform by contact with the knockdown mold frame, whereby cracking or formation of warpage can further be reduced. Further, the bottom plate 33 was constituted by two bottom plate-constituting members 33a and 33b placed on the pedestal 34, whereby it was made possible that at the time of reducing the pressure after completion of the pressing, the two bottom-constituting members 33a and 33b can move smoothly on the pedestal 34 in a direction to be mutually separated to accommodate an expansion of the convex portion of the green body.

As a raw material powder, a mixed powder comprising 10 wt % of a SnO$_2$ powder and 90 wt % of an In$_2$O$_3$ powder was filled into a space (130 mm×250 mm×30 mm, depth of concave portion of bottom plate: 5 mm) defined by the knockdown mold frame 32 and the bottom plate 33 having the concave portion, and on this raw material powder, the upper punch 31 was placed. A rubber sheet was put as a cushion on the upper punch to cover the clearance between the upper punch 31 and the knockdown mold frame 32. Then, the assembly was put in a plastic bag, and the interior of the bag was evacuated to carry out vacuum packing.

The molding die thus prepared was put into a cold isostatic press, and molding was carried out under a pressure of 1 ton/cm$^2$. The obtained green body was taken out from the mold, and the shape was confirmed, whereby a plate-shaped green body having a convex portion on one side and having no crack or warpage, was obtained.

Example 13

Using the same molding die as in Example 12 except that as a bottom plate 33 having a concave portion, a bottom plate composed of three bottom plate-constituting members 33c, 33d and 33e as shown in FIG. 8 was used, the molding die was put into a cold isostatic press in the same manner as in Example 12, and molding was carried out under a pressure of 1 ton/cm$^2$. The obtained green body was taken out from the mold, and the shape was confirmed, whereby a plate-shaped green body having a convex portion on one side and having no crack or warpage, was obtained.

Example 14

Using the same molding die as in Example 12 except that the space defined by the knockdown mold frame 32 and the bottom plate 33 was 250×600×30 mm, and the depth of the concave portion formed on the bottom plate was 5 mm, the molding die was put into a cold isostatic press in the same manner as in Example 12, and molding was carried out under a pressure of 1 ton/cm$^2$. The obtained green body was taken out from the mold, and the shape was confirmed, whereby a plate-shaped green body having a convex portion on one side and having no crack or warpage, was obtained.

Example 15

Figure 9:
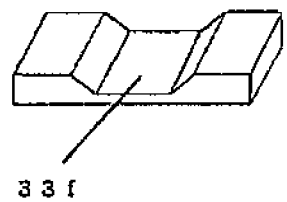
FIG. 9 is a perspective view showing still another embodiment of the bottom plate of the molding die of the present invention.

Using the same molding die as in Example 12 except that as the bottom plate 33 having a concave portion, an integral type bottom plate 33f as shown in FIG. 9 was used, and the molding die was put into a cold isostatic press in the same manner as in Example 12, and molding was carried out under a pressure of 1 ton/cm$^2$. The obtained green body was taken out from the mold, and the shape was confirmed, whereby a crack was observed at a forward end ridge portion of the convex portion formed on the plate surface of the plate-shaped green body.

Example 16

Figure 10:
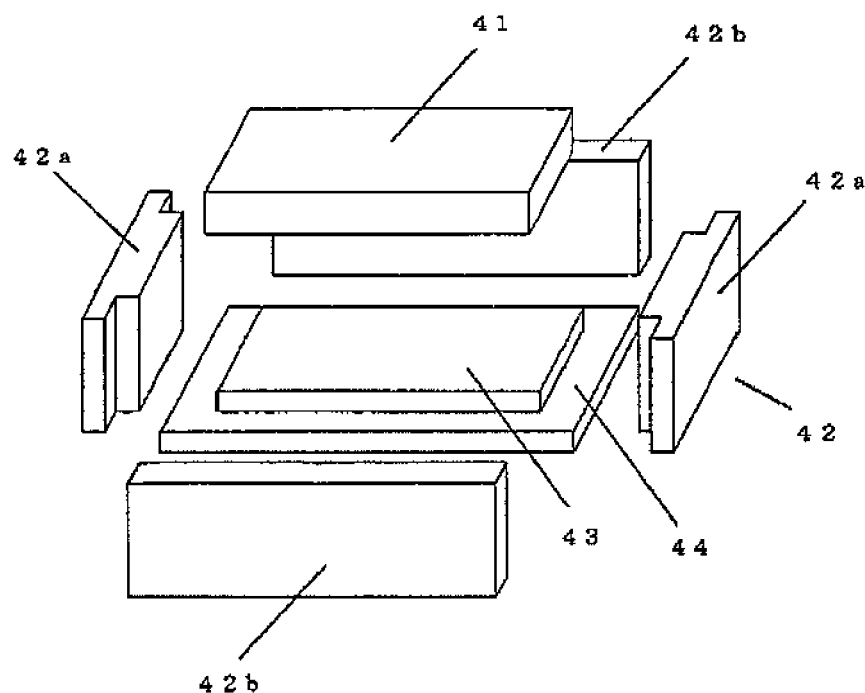
FIG. 10 is a perspective view schematically showing another embodiment of the molding die of the present invention as disassembled.

As shown in FIG. 10, the molding die used in this Example, comprises an upper punch 41, a knockdown mold frame 42 composed of frame members 42a and 42b, a bottom plate 43 and a pedestal 44. At both ends of the frame members 42a, stepped portions are formed to engage with end portions of frame members 42b to define the shape of the opening of the knockdown mold frame 42. The upper punch 41 was made of bakelite, the frame members 42a and 42b and the bottom plate 43 were made of super duralumin, and the pedestal 44 was made of bakelite. Further, the clearance between the knockdown mold frame 42 and the upper punch 51 was made to be 0.5 mm. Namely, the width and length of the upper punch 41 were formed to be smaller by 1.0 mm from the width and length of the shape of the opening of the knockdown mold frame 42, respectively.

The entire mold was stabilized by placing the knockdown mold frame 42 and the bottom plate 43 on the pedestal 44. Namely, by placing the knockdown mold frame 42 on the pedestal 44, it is possible to let the frame members 42a and 42b move smoothly on the pedestal 44 to accommodate an expansion of the green body which takes place at the time of reducing the pressure after completion of the pressing, and at the same time, under pressure during the molding, it is possible to prevent the movement in an up-and-down direction of the bottom plate 43 whose movement otherwise tends to be non-uniform by contact with the knockdown mold frame 42, whereby cracking or formation of warpage can further be reduced.

As a raw material powder, 18.4 kg of a mixed powder comprising 10 wt % of a SnO$_2$ powder and 90 wt % of an In$_2$O$_3$ powder was filled into a space (shape of the opening: rectangular of 400 mm×1,300 mm) defined by the knockdown mold frame 42 and the bottom plate 43, and on this raw material powder, the upper punch 41 was placed. A rubber sheet was put as a cushion on the upper punch to cover the clearance between the upper punch 41 and the knockdown mold frame 42. Then, the assembly was put in a plastic bag, and the interior of the bag was evacuated to carry out vacuum packing.

The molding die thus prepared was put into a cold isostatic press, and molding was carried out under a pressure of 1 ton/cm$^2$. The obtained green body was taken out from the mold, and the state was confirmed, whereby no crack or warpage was observed, and a green body of 401 mm×1,305 mm×10 mm was obtained.

Then, the green body was fired in an oxygen atmosphere by the following firing pattern. The temperature was raised from room temperature to 800° C. at a rate of 100° C./hr and to 1,600° C. at a rate of 50° C./hr, and the temperature was held at 1,600° C. for 3 hours and then lowered to room temperature at a rate of 100° C./hr. The sintered body was taken out, and the sintered body of 315 mm×1,025 mm×8 mm was obtained, and no breakage or cracks were observed. The sintered density of the obtained sintered body was 99.80% as a whole, and the difference in the sintered density between the largest portion and the smallest portion was 0.05%. Further, the true density of the sintered body was 7.156 g/cm$^3$.

Example 17

The molding die used in this Example comprises a knockdown mold frame 52, an upper punch 51 and a lower punch 58, and its plan view is shown in FIG. 11(a), and its side view is shown in FIG. 12. As shown in FIG. 12, the knockdown mold frame 52 is composed of frame members 52a and 52b, which are mutually assembled to form the mold frame. The frame members 52a and 52b are connected by passing bolts (screw-type pins) 55 through the engaged portions and constructed so that they can be fixed by tightening by screw nuts 56. As shown in FIGS. 11(a) and (b), at both end portions of the frame members 52a and 52b, bolt insertion holes 57 are provided so that bolts (screw-type pins) 55 as connecting members are to be inserted therethrough. The size of such a bolt insertion hole 57 is made to be larger by about 5 mm than the diameter of the bolt 55, and it is designed so that if the tightening by the bolt 55 and the nut 56 is loosened, the frame members 52a and 52b are movable in such a direction that the width and length of the shape of the opening of the knockdown mold frame will increase. Specifically, as shown in FIG. 12, as such bolt insertion holes, holes are formed to have a shape elongated in the diagonal lines of the shape of the opening of the knockdown mold frame.

As shown in FIG. 12, the upper punch 51 and the lower punch 58 are inserted in the knockdown mold frame 52. Such upper punch 51 and frame members 52a and 52b were made of bakelite, and the lower punch 58 was made of duralumin. The clearance between the knockdown mold frame 52 and the upper punch 51 was made to be 0.5 mm, and further, a Teflon (registered trademark) tape was bonded to the inner side surface of the knockdown mold frame 52 and on the side surface of the upper punch 51 to reduce the friction.

Such a knockdown mold frame 52 was assembled, and the bolts 55 were inserted and tightened by means of screw nuts 56 to fix the frame so that the raw material powder would not leak.

As a raw material powder, 9.6 kg of a ZnO powder having 2 wt % of $Al_2O_3$ added, was filled into a space (shape of the opening: rectangular of 390 mm×770 mm) defined by the knockdown mold frame 52 and the lower punch 58, and on this raw material powder, the upper punch 51 was placed. A rubber band or the like having a proper binding force was wound around the knockdown mold frame 52, whereupon screw nuts 56 on bolts 55 fixing the knockdown mold frame 52 were loosened. Rubber sheets were disposed as cushions on the upper punch and beneath the lower punch so as to cover the clearances between the upper and lower punches 51 and 58 and the knockdown mold frame 52. Then, the assembly was put in a plastic bag, and the interior of the bag was evacuated to carry out vacuum packing.

The molding die thus prepared was put into a cold isostatic press, and molding was carried out under a pressure of 1 ton/cm$^2$. The obtained green body was taken out from the mold, and the shape was confirmed, whereby no cracking or warping was observed, and a green body of 391 mm×773 mm×9.5 mm was obtained.

Example 18

Cold isostatic press molding was carried out under the same conditions as in Example 17 except that the raw material powder was a mixed powder comprising 10 wt % of a $SnO_2$ powder and 90 wt % of an $In_2O_3$ powder, and 17 kg of the powder was filled into the molding die. The obtained green body was taken out from the mold, and the shape was confirmed, whereby no cracking or warping was observed, and a green body of 391 mm×773 mm×13 mm was obtained.

Example 19

Cold isostatic press molding was carried out under the same conditions as in Example 17 by using the same molding die as in Example 17 except that as shown in FIG. 13, it has a bottom plate 63 and a pedestal 64 instead of the lower punch, and 17 kg of the powder was filled in the same manner as in Example 18. By placing the knockdown mold frame 62 on the pedestal 64, it is possible to let the frame members 62a and 62b move smoothly on the pedestal 64 to accommodate an expansion of the green body which takes place at the time of reducing the pressure after the press molding, and at the same time, it is possible to prevent the movement in the up-and-down direction of the bottom plate 63 whose movement tends to be non-uniform by contact with the knockdown mold frame, whereby cracking or formation of warpage can further be reduced.

The obtained green body was taken out from the mold, and the shape was confirmed, whereby no cracking or warping was observed, and a green body of 391 mm×773 mm×13 mm was obtained.

Comparative Example 5

A green body was prepared by carrying out isostatic pressing in the same manner as in Example 17 except that by using the same molding die as in Example 17 except that the shape of the bolt-insertion hole was circular, and the difference between its diameter and the diameter of the bolt to be inserted was 1 mm or less, and even after filling the powder, pressing was carried out while the bolts and nuts were tightened. After the pressing, the green body was taken out from the molding die, and the shape was confirmed, whereby large crack in the longitudinal direction was observed.

Example 20

To a mixed powder comprising 10 wt % of a $SnO_2$ powder and 90 wt % of an $In_2O_3$ powder, 0.6 wt % of a paraffin binder was added to prepare a raw material powder. A cold isostatic press molding was carried out under the same conditions as in Example 1 by using the same molding die as in Example 1 except that 17 kg of this raw material powder was filled into the molding die. The obtained green body was taken out from the mold, and the shape was confirmed, whereby no cracking or warping was observed, and a green body of 391 mm×773 mm×16 mm was obtained.

The obtained green body was set in a firing furnace, and firing was carried out in the same manner as in Example 4 except that the temperature-raising rate to 450° C. was changed to 50° C./hr, to obtain a sintered body having a size of about 307 mm×607 mm×13 mm and having no cracks.

Comparative Example 6

In the same manner as in Example 20 except that the amount of the paraffin binder added was changed to 0.8 wt %, a green body having no cracking or warping was obtained.

The obtained green body was fired in the same manner as in Example 20, but many cracks were observed on the surface of the sintered body, and further, breakage in the longitudinal direction was observed.

INDUSTRIAL APPLICABILITY

The present invention provides a sintered body obtainable by firing a green body obtained by molding a ceramics powder, a metal powder or a mixed powder thereof by means of cold isostatic pressing, a sputtering target using such a sintered body, and a molding die to be used for the production of the green body, and a process for the production of the sintered body by means of such a molding die.

The entire disclosure of Japanese Patent Application No. 2005-025655 filed on Feb. 1, 2005 including specification, claims, drawings and summary is incorporated herein by reference in its entirety.

The invention claimed is:

1. A process for producing an ITO sintered body, which comprises:
    providing a raw material powder which lacks a molding aid containing an organic substance;
    pressing the raw material powder in only a uniaxial direction to form a compressed green body;
    releasing the pressure on said compressed green body isotropically; and
    firing the green body to form the ITO sintered body.
2. The process for producing the ITO sintered body according to claim 1, wherein the raw material powder is molded directly by a cold isostatic press to obtain the green body.

3. The process for producing the ITO sintered body according to claim 2, wherein a molding die, for compression molding is used, wherein said molding die is a molding die for producing said compressed green body by filling and compressing a raw material powder in the molding die and which is characterized by having such a construction that at the time of pressure compression, pressing is applied to the filled raw material powder in only the uniaxial direction, and at the time of reducing the pressure after the completion of pressing, the pressure can be released isotropically with respect to said compressed green body.

4. A process for producing an ITO sintered body, which comprises:
providing a raw material powder which lacks a molding aid containing an organic substance;
pressing the raw material powder in only a uniaxial direction to form a compressed green body; and
releasing the pressure on said compressed green body isotropically;
wherein the process lacks a firing step intended to remove the organic substance from said compressed green body.

5. The process for producing the ITO sintered body according to claim 4, wherein a raw material powder having an organic substance content of 0.6 wt % or less, is used.

6. The process for producing the ITO sintered body according to claim 4, wherein a molding die, for compression molding is used, wherein said molding die is a molding die for producing said compressed green body by filling and compressing a raw material powder in the molding die and which is characterized by having such a construction that at the time of pressure compression, pressing is applied to the filled raw material powder in only the uniaxial direction, and at the time of reducing the pressure after the completion of pressing, the pressure can be released isotropically with respect to said compressed green body.

* * * * *